(12) United States Patent
Reese et al.

(10) Patent No.: US 10,947,773 B2
(45) Date of Patent: Mar. 16, 2021

(54) ONE OR MORE DOORS WITH ONE OR MORE ANGLED SIDE FLANGES FOR ELECTRICAL PANEL ENCLOSURE

(71) Applicant: Cooper Technologies Company, Houston, TX (US)

(72) Inventors: Robert J. Reese, Highland, IL (US); Ken Huggins, Plano, TX (US); Jason S. Mevius, McKinney, TX (US)

(73) Assignee: Cooper Technologies Company, Houston, TX (US)

( * ) Notice: Subject to any disclaimer, the term of this patent is extended or adjusted under 35 U.S.C. 154(b) by 276 days.

(21) Appl. No.: 15/816,790

(22) Filed: Nov. 17, 2017

(65) Prior Publication Data

US 2018/0135350 A1 May 17, 2018

Related U.S. Application Data

(60) Provisional application No. 62/423,582, filed on Nov. 17, 2016.

(51) Int. Cl.
| | |
|---|---|
| *H05K 5/02* | (2006.01) |
| *E05B 65/02* | (2006.01) |
| *E06B 7/22* | (2006.01) |
| *H02B 1/00* | (2006.01) |
| *H02B 1/38* | (2006.01) |
| *E05C 9/04* | (2006.01) |
| *H02B 1/28* | (2006.01) |

(52) U.S. Cl.
CPC ............... *E06B 7/22* (2013.01); *E05B 65/02* (2013.01); *E05C 9/04* (2013.01); *H02B 1/00* (2013.01); *H02B 1/38* (2013.01); *H05K 5/0226* (2013.01); *H02B 1/28* (2013.01)

(58) Field of Classification Search
CPC .. H02B 1/38; H02B 1/28; E05B 65/02; E05C 9/04; E06B 7/22; H05K 5/0226
See application file for complete search history.

(56) References Cited

U.S. PATENT DOCUMENTS

| | | | | |
|---|---|---|---|---|
| 3,157,306 | A * | 11/1964 | Courson | ................. F25D 21/04 |
| | | | | 220/592.06 |
| 3,178,246 | A * | 4/1965 | Riles | ..................... A47B 47/03 |
| | | | | 312/265.4 |
| D210,078 | S | 2/1968 | Eck | |
| 4,940,299 | A * | 7/1990 | Lazenby | ............... A47B 47/02 |
| | | | | 312/285 |

(Continued)

FOREIGN PATENT DOCUMENTS

| | | | |
|---|---|---|---|
| CN | 201830589 U | * | 5/2011 |
| CN | 204168660 U | * | 2/2015 |

OTHER PUBLICATIONS

CN20168660U Machine Translation (Year: 2011).*
CN201830589 Machine Translation (Year: 2015).*

*Primary Examiner* — Kimberley S Wright
(74) *Attorney, Agent, or Firm* — Stinson LLP

(57) ABSTRACT

An electrical panel enclosure includes a door hingedly secured to an enclosure body at the front side of the enclosure body. The door includes a door panel having a planar door panel body with opposite first and second side edge margins, and a first side door flange extending rearwardly from the first side edge margin of the door panel body. The first side door flange extends at an angle greater than 90 degrees relative to the planar door panel body.

18 Claims, 22 Drawing Sheets

(56) References Cited

U.S. PATENT DOCUMENTS

| | | | |
|---|---|---|---|
| 5,056,577 A | 10/1991 | DeLong et al. | |
| D324,965 S | 3/1992 | Nelsen | |
| D349,888 S | 8/1994 | Yamamoto et al. | |
| 5,347,778 A | 9/1994 | Bray | |
| 5,467,250 A * | 11/1995 | Howard | H05K 7/206 |
| | | | 165/122 |
| D365,086 S | 12/1995 | Spechts | |
| 5,483,905 A * | 1/1996 | Johansson | A47B 81/00 |
| | | | 109/79 |
| 5,573,319 A * | 11/1996 | Dirk | H02B 1/50 |
| | | | 174/520 |
| 5,641,215 A * | 6/1997 | Pochet | E05B 65/0003 |
| | | | 312/107.5 |
| 5,822,180 A | 10/1998 | Deschamps et al. | |
| 6,170,928 B1 * | 1/2001 | Eardley | E05B 17/0025 |
| | | | 312/223.1 |
| 6,445,585 B1 | 9/2002 | Walker | |
| 6,478,391 B1 | 11/2002 | Stoever | |
| D479,883 S | 9/2003 | Gresham | |
| 6,667,438 B2 * | 12/2003 | Schneider | H02B 7/06 |
| | | | 16/221 |
| D503,931 S | 4/2005 | Kauranen et al. | |
| 6,877,827 B2 * | 4/2005 | Holighaus | H02B 1/30 |
| | | | 312/213 |
| D543,161 S | 5/2007 | Stepputat | |
| D588,081 S | 3/2009 | Lewis, II et al. | |
| D615,325 S | 5/2010 | Holcomb | |
| 7,871,137 B2 * | 1/2011 | Schulz | H02B 1/28 |
| | | | 312/296 |
| 7,952,042 B2 | 5/2011 | Coomer et al. | |
| D653,224 S | 1/2012 | Jonas et al. | |
| 8,147,008 B2 * | 4/2012 | Guebre-Tsadik | ............................ |
| | | | E05B 65/0003 |
| | | | 312/109 |
| D669,694 S | 10/2012 | Yoo et al. | |
| D670,510 S | 11/2012 | Daino et al. | |
| 9,318,883 B2 * | 4/2016 | Schmidt | H02B 13/025 |
| 9,780,537 B2 * | 10/2017 | Bonfanti | H02B 1/28 |
| D812,025 S | 3/2018 | Cagliani et al. | |
| 10,010,003 B2 | 6/2018 | Chang et al. | |
| D830,975 S | 10/2018 | Vierjarvi et al. | |
| D857,639 S | 8/2019 | Reese et al. | |
| 10,537,038 B2 | 1/2020 | Reese et al. | |
| 2003/0102141 A1 * | 6/2003 | Schneider | H02B 7/06 |
| | | | 174/50 |
| 2004/0239215 A1 | 12/2004 | Sargeant | |
| 2006/0243690 A1 | 11/2006 | Mollard | |
| 2009/0052143 A1 | 2/2009 | Chiu | |
| 2009/0173118 A1 * | 7/2009 | Schulz | H02B 1/28 |
| | | | 70/275 |
| 2011/0001404 A1 * | 1/2011 | Lear | A47B 95/02 |
| | | | 312/213 |
| 2011/0001411 A1 | 1/2011 | Borning et al. | |
| 2011/0115345 A1 | 7/2011 | Kang | |
| 2011/0181160 A1 | 7/2011 | Peng et al. | |
| 2012/0062084 A1 | 3/2012 | Lewis, II et al. | |
| 2012/0299455 A1 | 11/2012 | Li et al. | |
| 2013/0320831 A1 * | 12/2013 | Schmidt | H02B 13/025 |
| | | | 312/296 |
| 2013/0342091 A1 | 12/2013 | Walker et al. | |
| 2014/0084766 A1 * | 3/2014 | Smith | H05K 5/0217 |
| | | | 312/292 |
| 2014/0104759 A1 | 4/2014 | Takano | |
| 2015/0002006 A1 | 1/2015 | Segroves et al. | |
| 2015/0075080 A1 * | 3/2015 | Ellingson | E06L 37/2309 |
| | | | 49/483.1 |
| 2015/0173253 A1 | 6/2015 | Lewis, II et al. | |
| 2016/0219729 A1 | 7/2016 | Omani et al. | |
| 2016/0255421 A1 | 9/2016 | Farrar et al. | |
| 2016/0372896 A1 | 12/2016 | Strong et al. | |
| 2017/0040778 A1 * | 2/2017 | Bonfanti | H02B 1/38 |
| 2017/0150636 A1 | 5/2017 | Segroves et al. | |
| 2017/0172015 A1 | 6/2017 | Yu et al. | |
| 2018/0098456 A1 | 4/2018 | Schreier et al. | |
| 2018/0139859 A1 * | 5/2018 | Reese | H02B 1/38 |
| 2018/0213667 A1 | 7/2018 | Midday et al. | |
| 2018/0213670 A1 | 7/2018 | Freire | |
| 2018/0213673 A1 | 7/2018 | Eckberg et al. | |
| 2018/0298654 A1 * | 10/2018 | Harder | E05C 9/04 |
| 2019/0055752 A1 * | 2/2019 | Anderson | H02B 1/00 |

\* cited by examiner

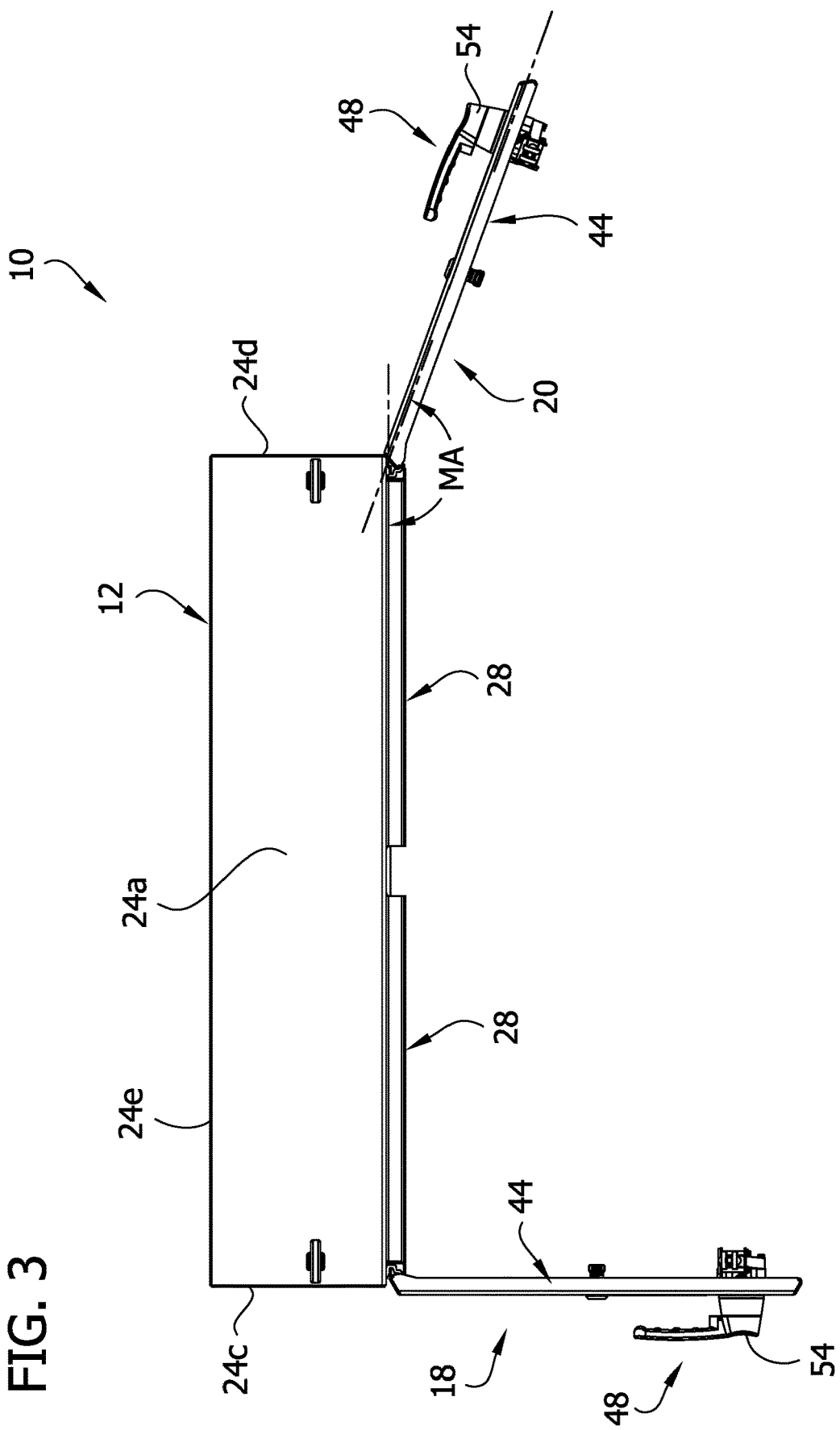

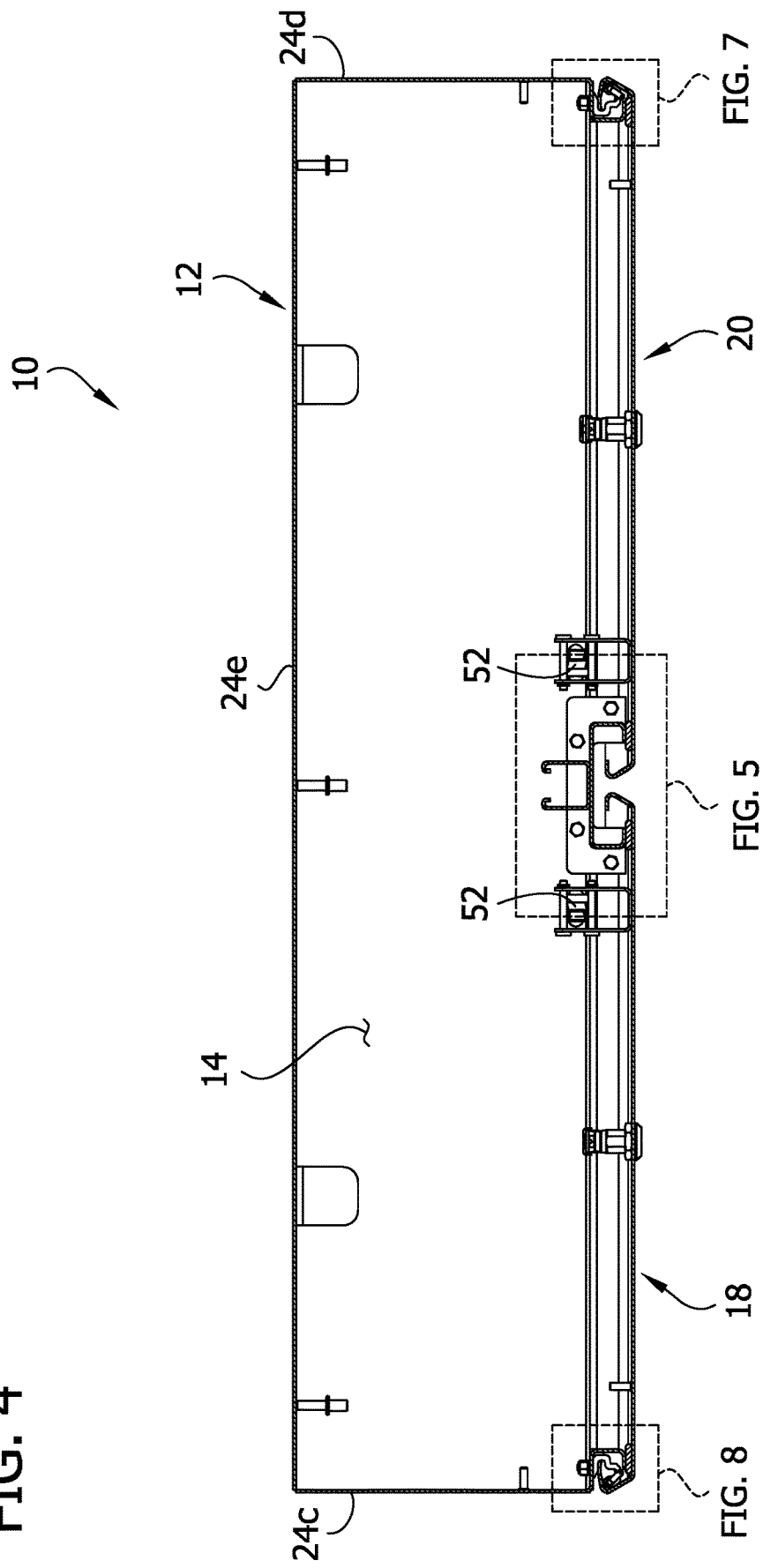

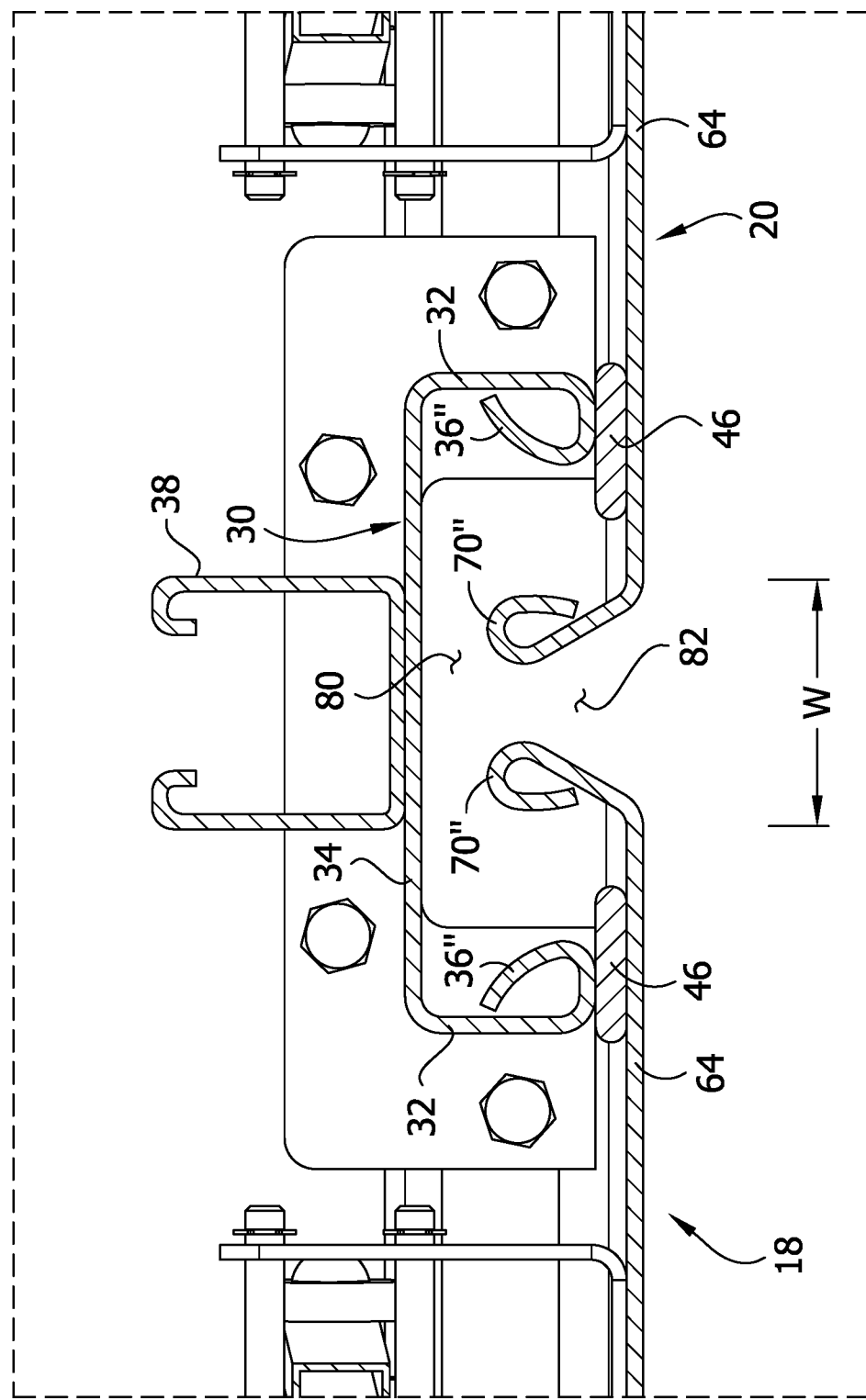

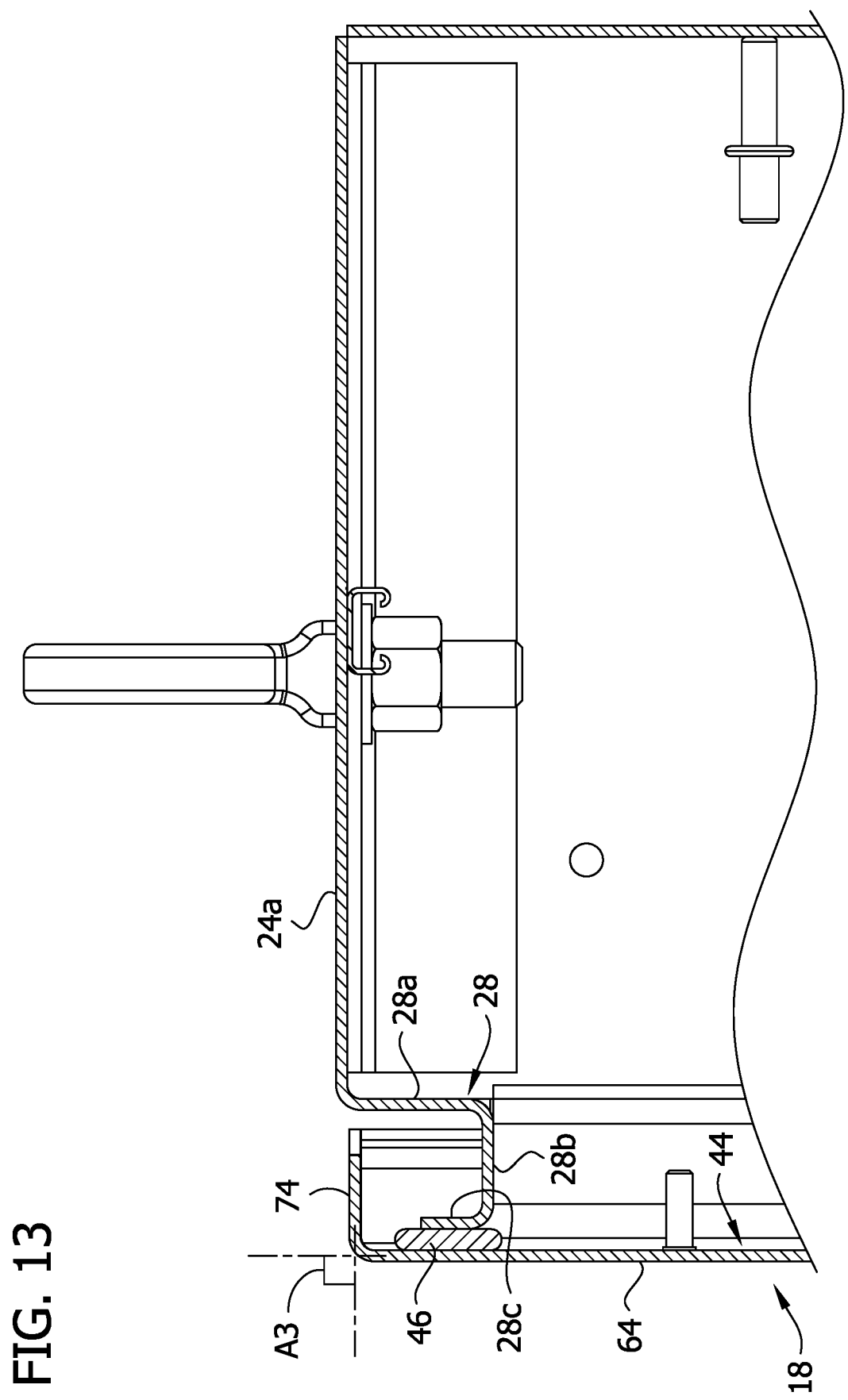

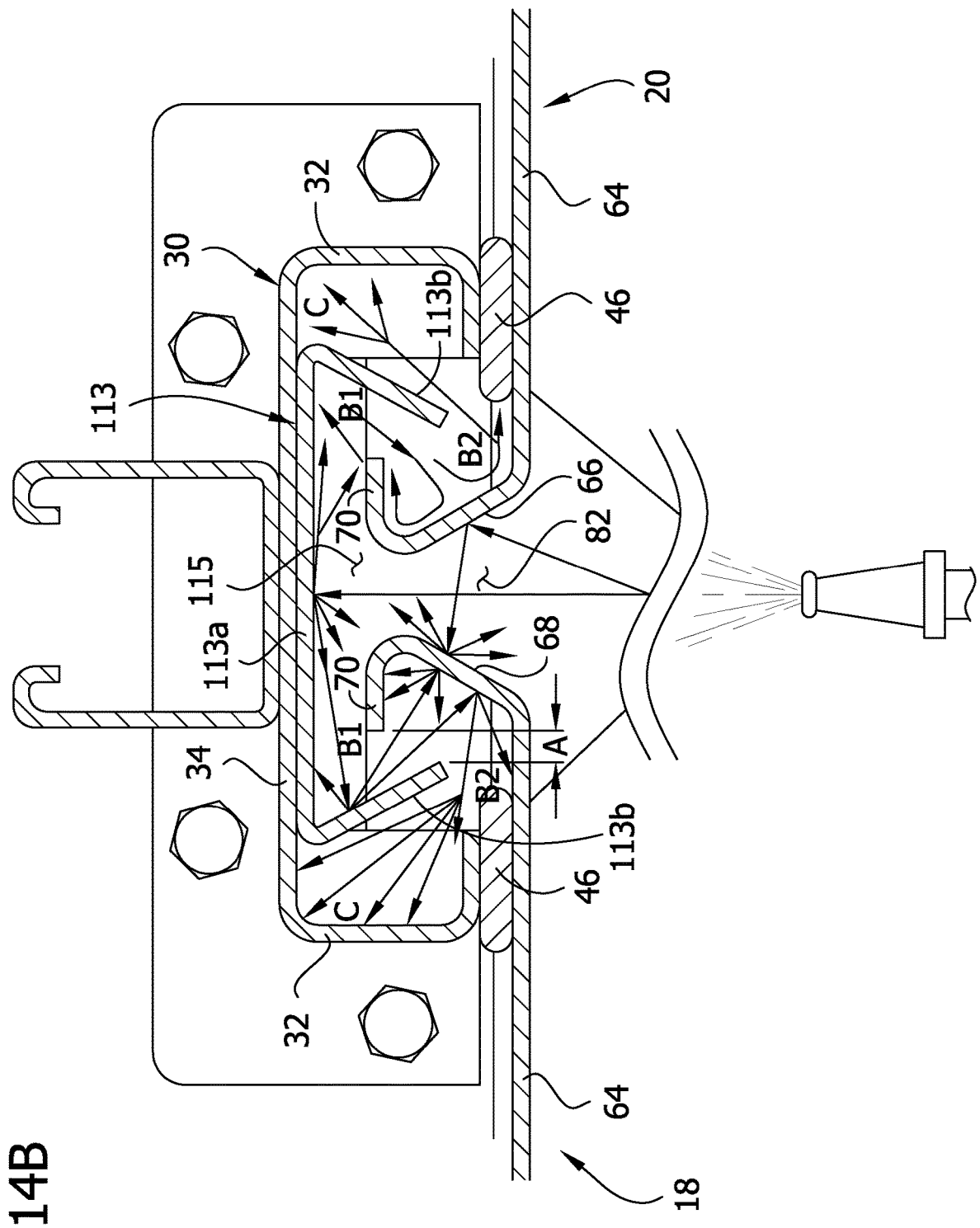

ONE OR MORE DOORS WITH ONE OR MORE ANGLED SIDE FLANGES FOR ELECTRICAL PANEL ENCLOSURE

FIELD OF THE DISCLOSURE

The present disclosure generally relates to one or more doors with one or more angled side flanges for an electrical panel enclosure.

BACKGROUND OF THE DISCLOSURE

Electrical control panels are collections of electrical power and control components and operator devices housed within an electrical panel enclosure designed to serve a specified purpose. Certain electrical panel enclosure should meet certain safety standards, in particular, safety standards pertaining to the ingress of water or other liquid into the enclosure. An example of such a safety standard is UL 508A, "Industrial Control Panels."

SUMMARY OF THE DISCLOSURE

In one aspect, a door hingedly secured to an enclosure body at a front side of the enclosure body includes a door panel having a planar door panel body with opposite first and second side edge margins, and a first side door flange extending rearwardly from the first side edge margin of the door panel body. The first side door flange extends at an angle greater than 90 degrees relative to the planar door panel body.

Other features will be in part apparent and in part pointed out hereinafter.

BRIEF DESCRIPTION OF THE DRAWINGS

FIG. 3 is a top plan view of FIG. 2;

FIG. 4 is a cross section of the enclosure taken in the plane defined by the line 4-4 in FIG. 1;

FIG. 5C is similar to FIG. 5A, except return lips and return flanges are shown as being teardrop hems;

FIG. 13 is a partial cross section of the enclosure taken in the plane defined by the line 13-13 in FIG. 1;

FIG. 14B is similar to FIG. 14A, but showing flow of liquid;

Corresponding reference characters indicate corresponding parts throughout the drawings.

DETAILED DESCRIPTION OF THE DISCLOSURE

Figure 1:
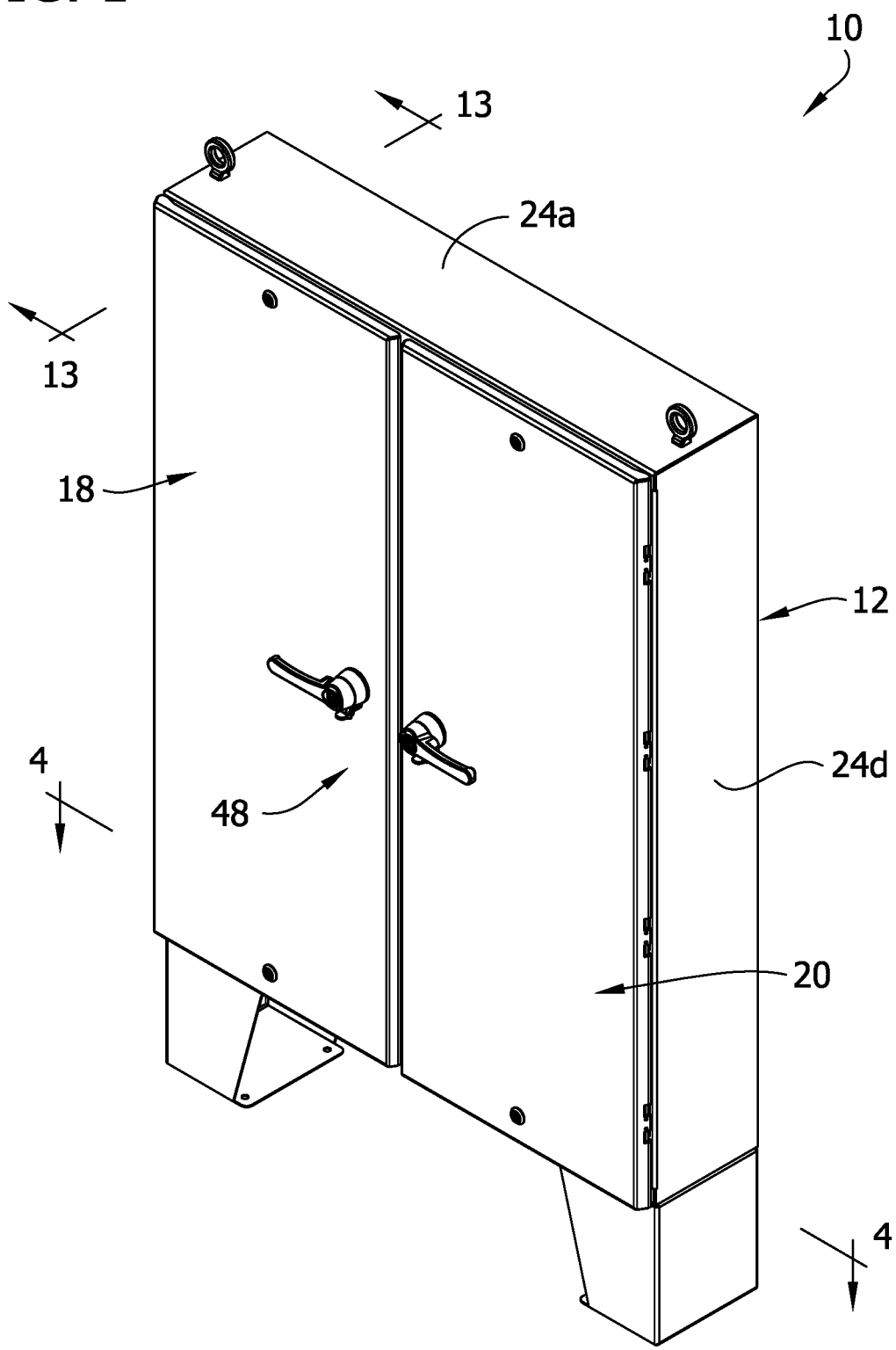
FIG. 1 is a perspective of an electrical panel enclosure configured to house electrical components, such as electrical power and control components, doors of the enclosure being in closed positions.
Figure 2:
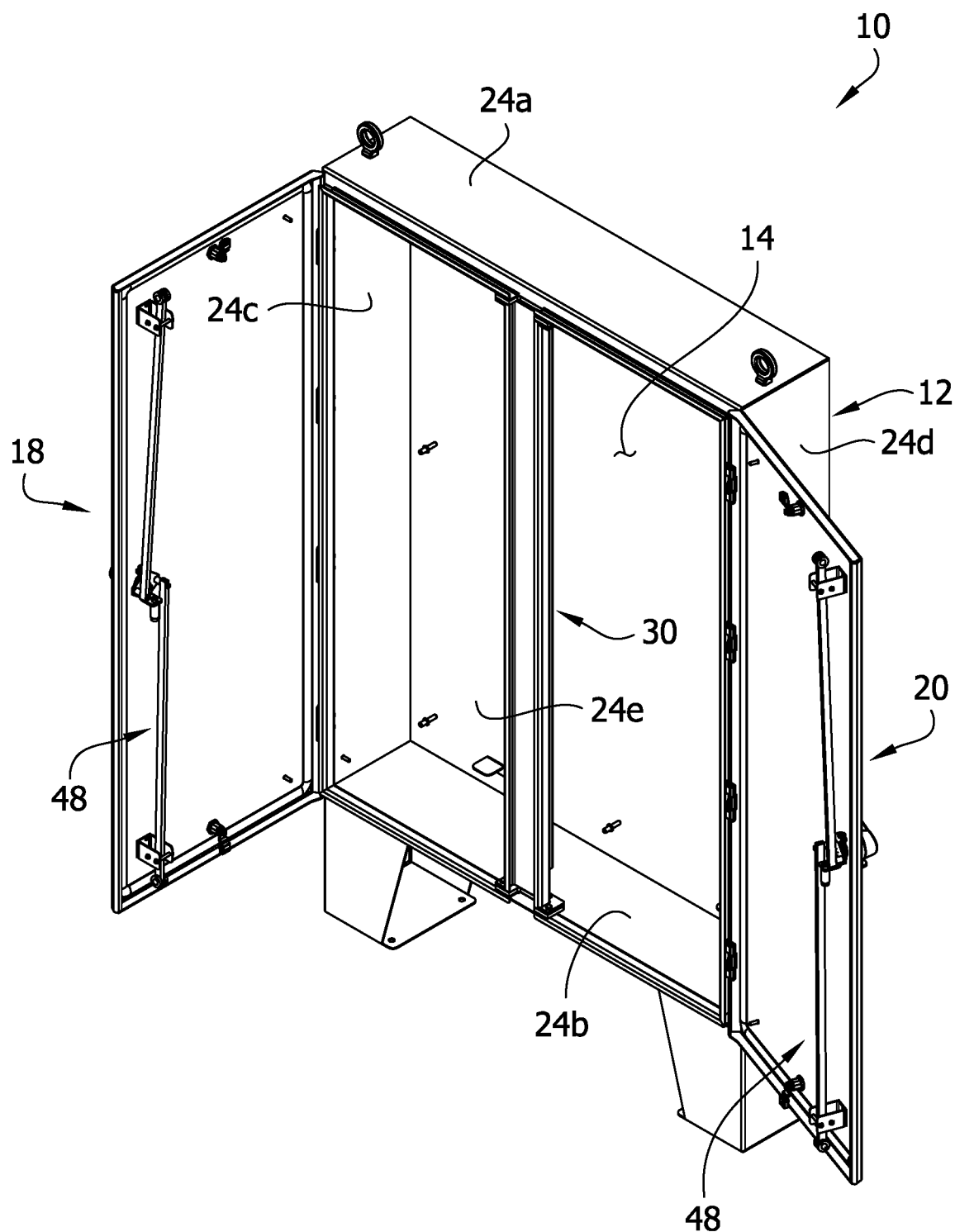
FIG. 2 is similar to FIG. 1 with the doors being in open positions.

Referring to FIG. 1 of the drawings, one embodiment of an electrical panel enclosure configured to house electrical components, such as electrical power and control components, is generally indicated at reference numeral 10. The electrical panel enclosure 10 comprises an enclosure body, generally indicated at 12, defining an interior space 14 in which the electrical components are housed, and left and right (broadly, first and second) doors, generally indicated at 18, 20, respectively, secured to the enclosure body. The enclosure body 12 includes opposite upper and lower walls, 24a, 24b, respectively; opposite left and right side walls, 24c, 24d, respectively; and a rear wall 24e secured to one another, such as by welding. As used herein, terms denoting relative locations of structures and components, including but not limited to "upper," "lower," "left," "right," "rear," "front," and like terms, are used to describe relative locations as shown in the drawings, and are not meant in a limiting sense.

Figure 7:
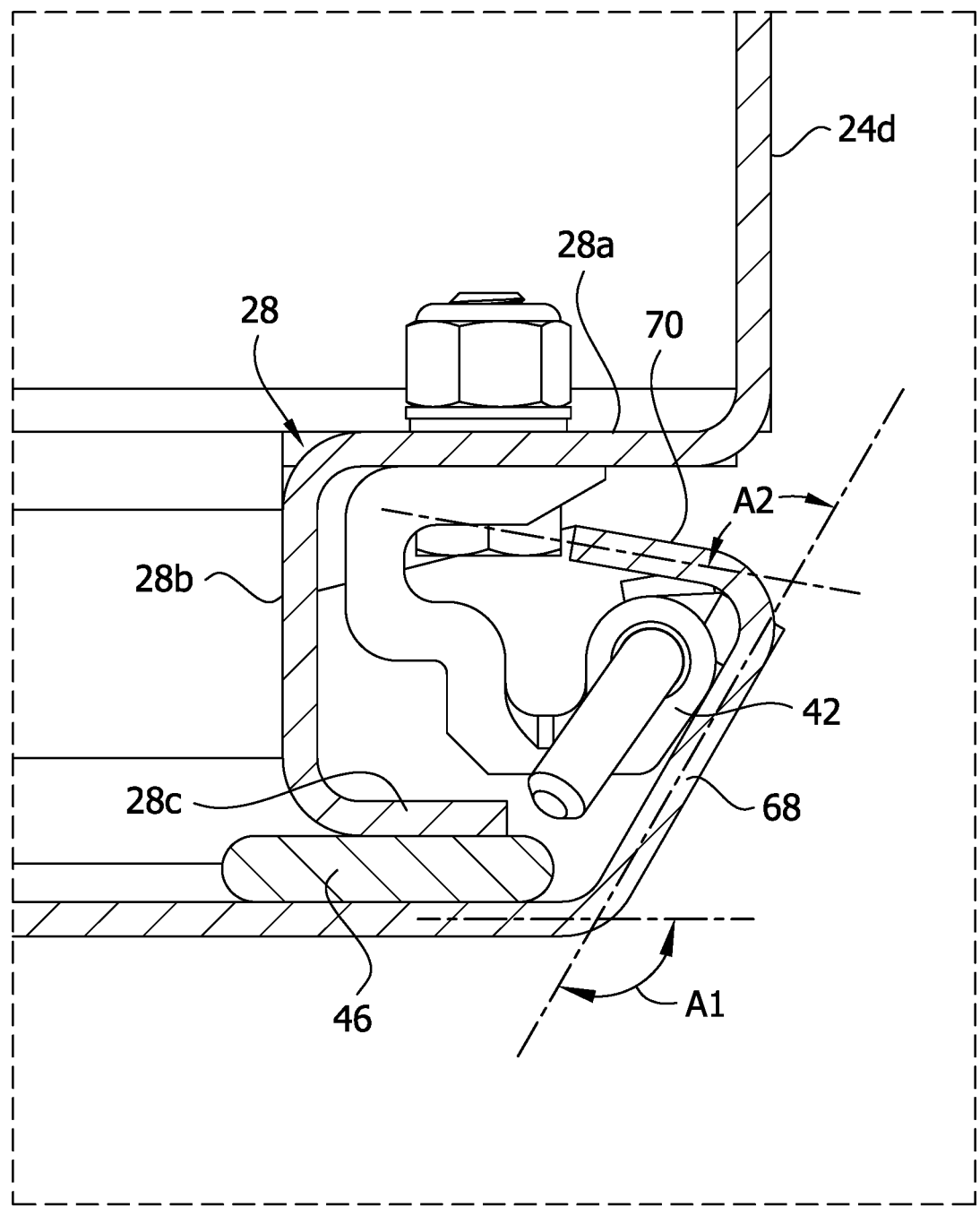
FIG. 7 is an enlarged, partial view of the cross section of the enclosure as indicated in FIG. 4.
Figure 8:
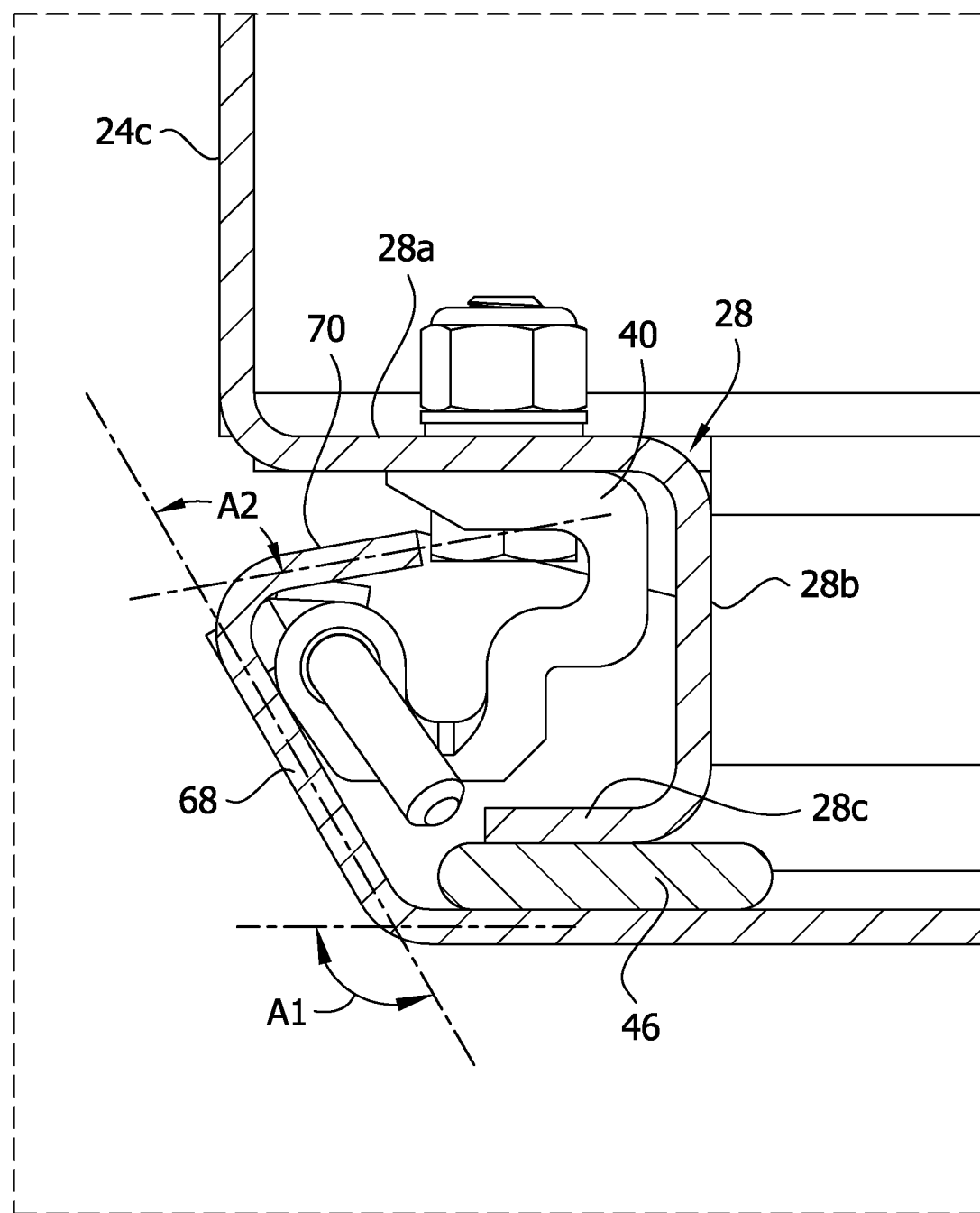
FIG. 8 is an enlarged, partial view of the cross section of the enclosure as indicated in FIG. 4.

In general, the enclosure body 12 has a box shape, although it may be of other shapes without departing from the scope of the present disclosure. A front side of the enclosure 10 is open to the interior space 14 of the enclosure body 12. In one example, the upper, lower, left, and right walls 24a, 24b, 24c, 24d, respectively, may be formed from sheet metal, such as steel. The enclosure body 12 may be of other configurations and formed in other ways. The upper, lower, left, and right walls 24a, 24b, 24c, 24d, respectively, have front margins defining channel frame members, generally indicated at 28, extending around a perimeter of the open front side of the enclosure body 12. As can be seen in FIGS. 7, 8, and 13, for example, the channel frame members 28 are generally J-shaped in cross section. The channel frame members 28 have an inwardly extending first wall 28a, a second wall 28b extending forward from the first wall, and a front wall (or lip) 28c extending outwardly from the second wall and generally parallel to the first wall. In other examples, the channel frame members may be formed from metal bar stock or other material and secured to the upper, lower, left, and right walls, 24a, 24b, 24c, 24d, respectively, for example.

Figure 5A:
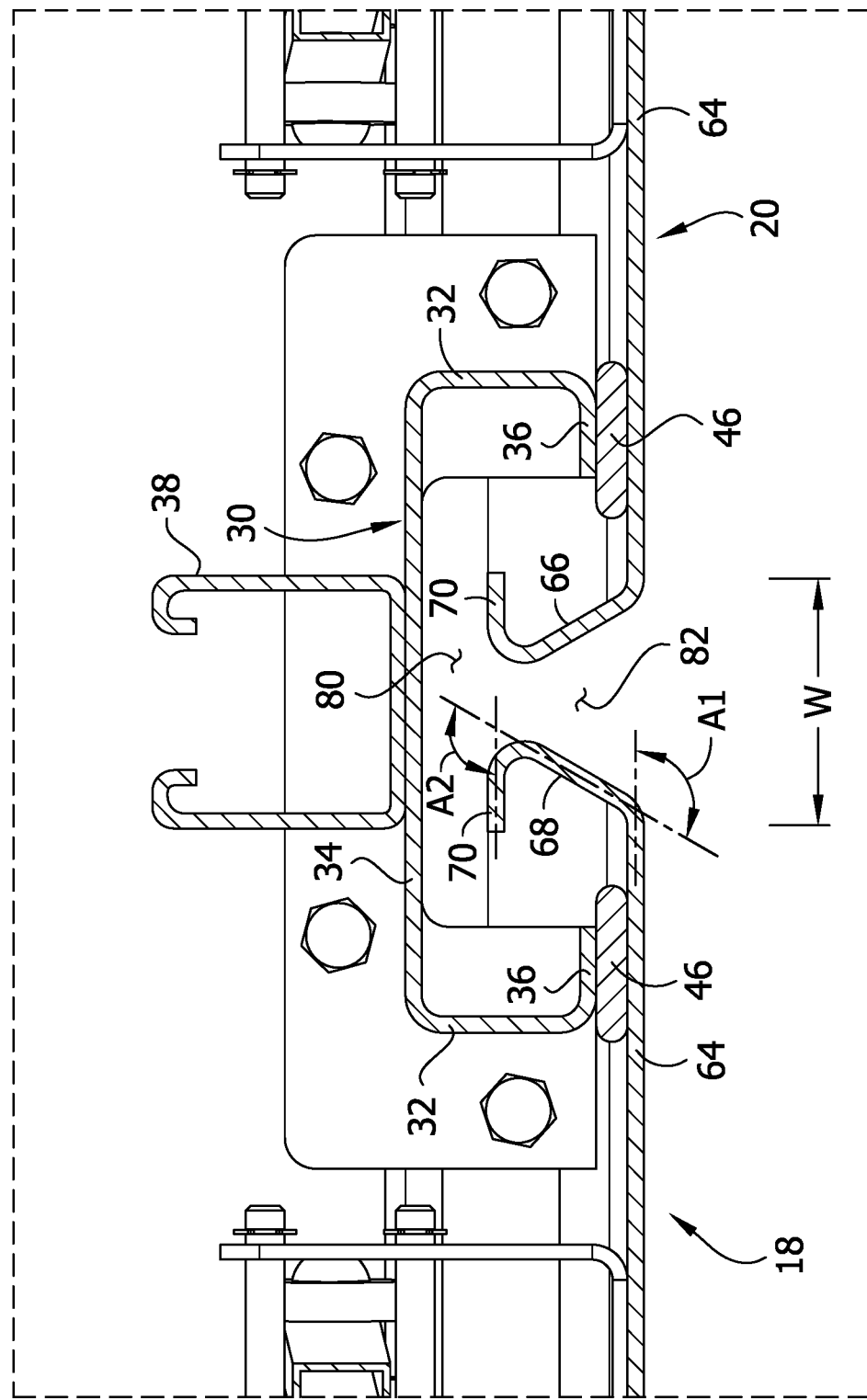
FIG. 5A is an enlarged, partial view of the cross section of the enclosure as indicated in FIG. 4.
Figure 5B:
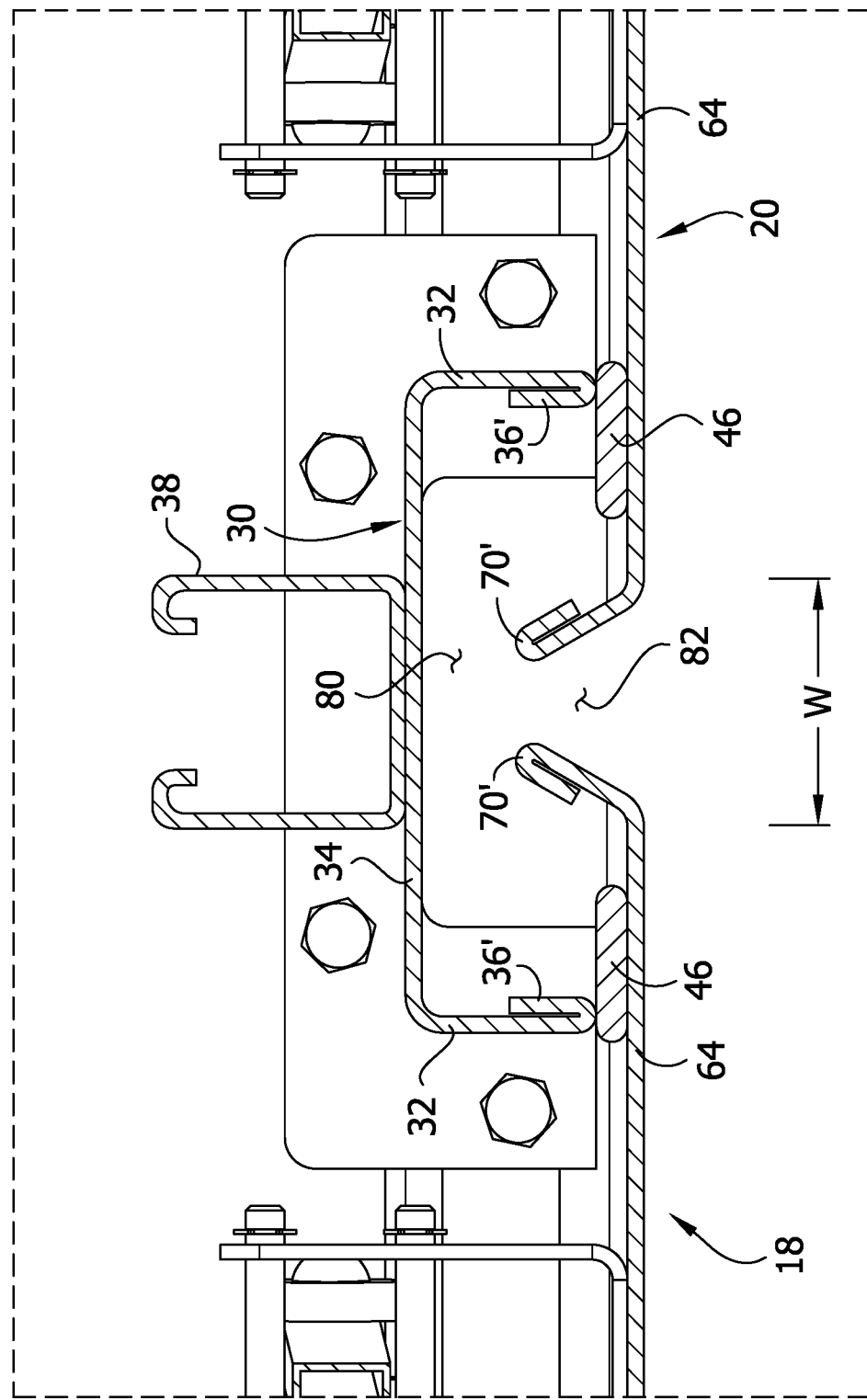
FIG. 5B is similar to FIG. 5A, except return lips and return flanges are shown as being flattened hems.
Figure 6:
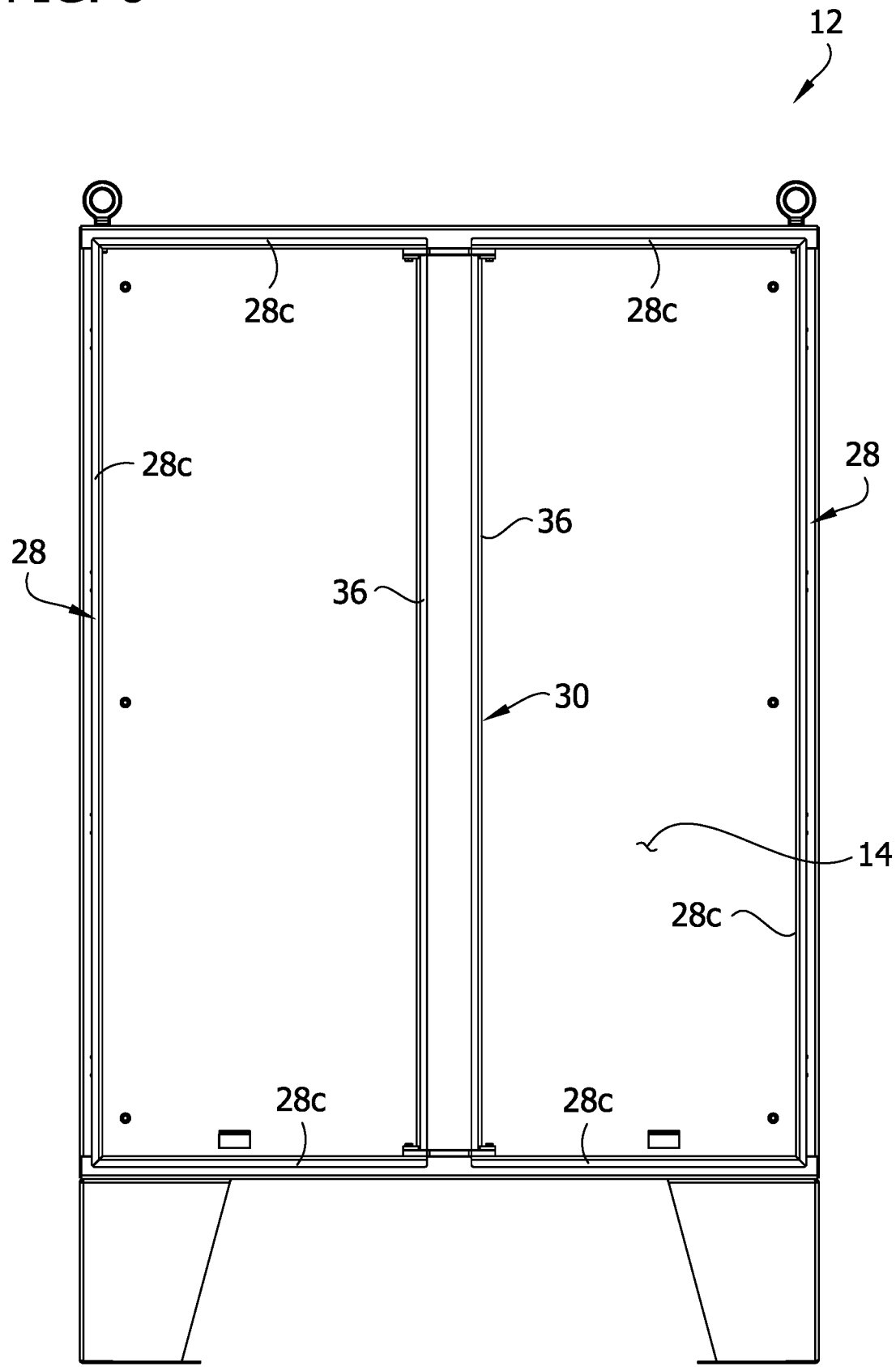
FIG. 6 is a front elevation of the enclosure, with the doors removed therefrom.

A center frame post, generally indicated at 30, extends heightwise between and interconnects upper and lower portions (e.g., the raised front edge margins 28 of the upper and lower walls 24a, 24b, respectively) of the front perimeter frame member. As shown in FIG. 5, the illustrated center frame post 30 is generally channel-shaped having opposite side walls 32 extending forward from a rear wall 34 of the center post, and return flanges 36 extending toward one another from the front ends of the respective side walls. The return flanges 36 may be coplanar with the front third wall 28c or extend at other angles. In other embodiments, the return flanges 36 may be hemmed. For example, the return flanges may be formed as flattened hems 36', as shown in FIG. 5B, or tear drop hems 36", as shown in FIG. 5C, or other types of hems, including but not limited to open hems, and rope hems. The center frame post 30 and the front channel members 28 define left and right door frames (broadly, first and second doors) for the respective left and right doors 18, 20, respectively. The center frame post 30 may be formed from metal, such as steel. The center frame post 30 may be welded and/or bolted, or otherwise fastened or attached to the front peripheral frame. In the illustrated embodiment, a strut 38 is secured (e.g., welded) to a rear side of the rear wall 34 of the center frame post 30 to provide structural support to the center frame post.

As shown in FIG. 8, the left door 18 is hingedly coupled to the left side wall 24c at the front side of the enclosure 10 via one or more first hinges 40, for example. The left door 18 is selectively pivotable away from and toward the front side of the enclosure 10 to open and close a left side portion of the front side of the enclosure defined by a left portion of the channel member 28 and the center frame post 30. As shown in FIG. 7, the right door 20 is hingedly coupled to the right side wall 24d at the front side of the enclosure 10 via one or more second hinges 42, for example. The right door 20 is selectively pivotable away from and toward the front side of the enclosure 10 to open and close a right side portion of the front side of the enclosure defined by a right portion of the front perimeter frame member and the center frame post 30. In the illustrated embodiment, the left and right hinges 40, 42 are hidden by the respective left and right doors 18, 20. In particular, the hinges 40, 42 are received in channels defined by the channel frame members 28 at the left and right sides of the enclosure 10. Each door 18, 20 includes a door panel (e.g., sheet metal panel), generally indicated at 44; a door gasket 46 secured to an interior side of the door panel; and a door handle assembly, generally indicated at 48, secured to the door panel.

Figure 9:
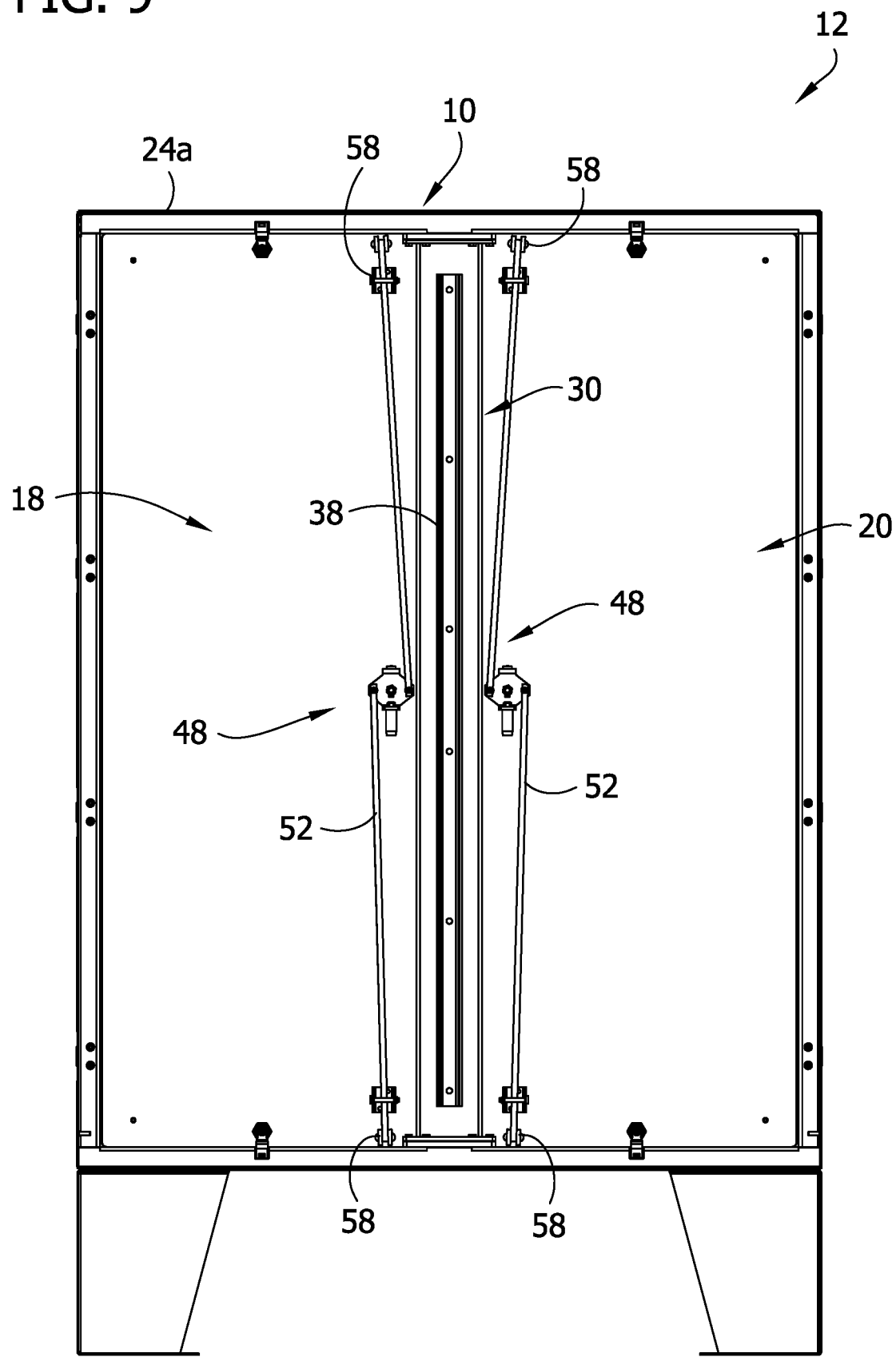
FIG. 9 is a rear elevation of the enclosure with a rear wall of the enclosure removed.
Figure 10:
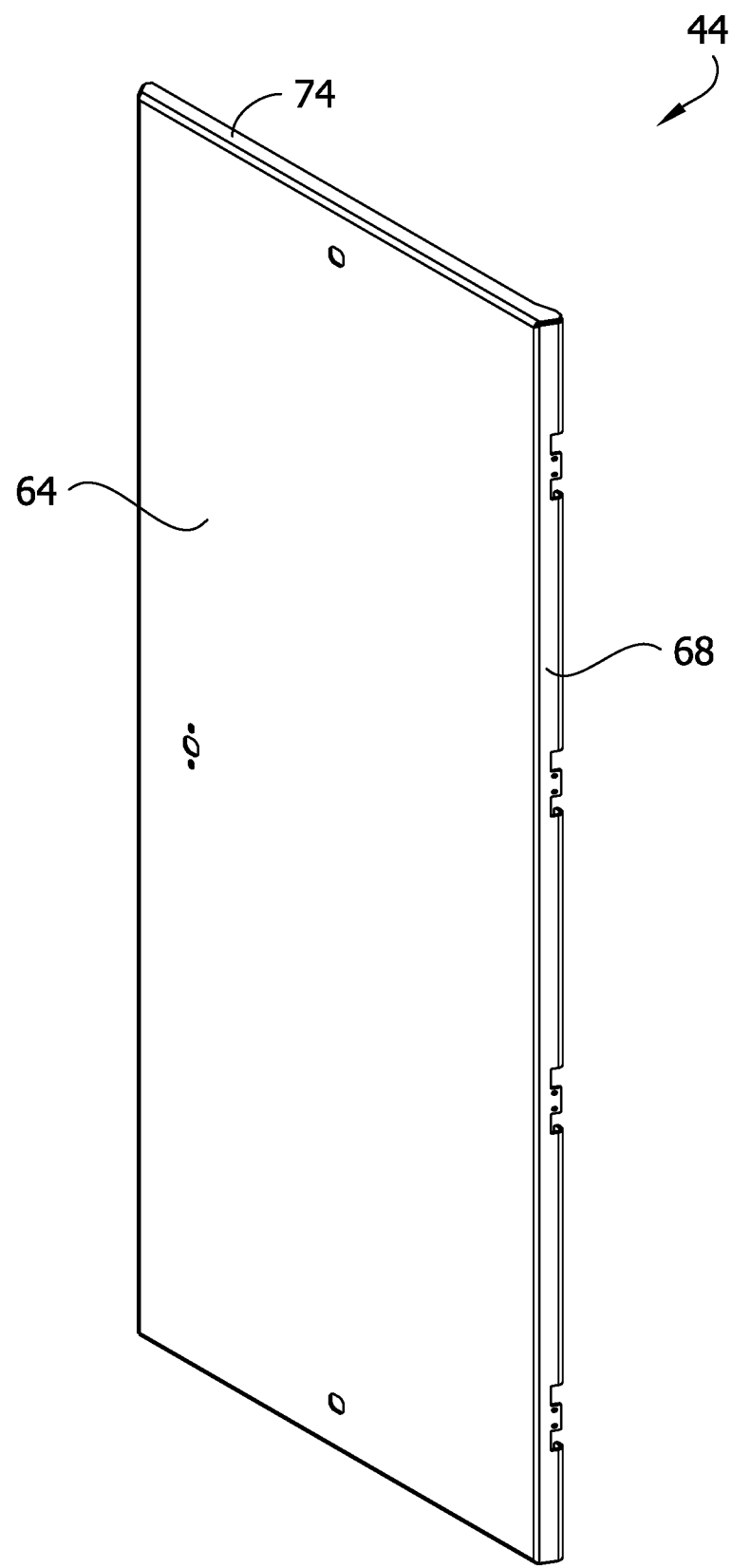
FIG. 10 is a perspective of a door panel of one of the doors of the enclosure.

Each illustrated door handle assembly 48 is a conventional door handle assembly for electrical panel enclosures. Briefly, each door handle assembly 48 includes a bar assembly 52 (FIG. 9) having a length extending heightwise of the corresponding door, and a handle 54 operatively connected to the bar assembly. The length of the bar assembly 52 is selectively adjustable by turning the associated handle 54. When the door 18, 20 is closed and the bar assembly 52 is in its lengthened configuration, longitudinal ends of the bar assembly (e.g., upper and lower rollers 58) may engage upper and lower portions of the door frame to inhibit opening of the door. To open the door 18, 20, the handle 54 is rotated, whereby the bar assembly 52 is shortened and the longitudinal ends of the bar assembly clear the upper and lower portions of the door frame and the door can be pivoted to its open position. As is also generally known, the door handle assembly 48 may also have a lock assembly for restricting access to the interior of the enclosure 10. In addition or alternatively, separate lock assemblies may be associated with the doors 18, 20. It is understood that the doors 18, 20 may include other types of door handle assemblies without departing from the scope of the present invention.

Figure 11:
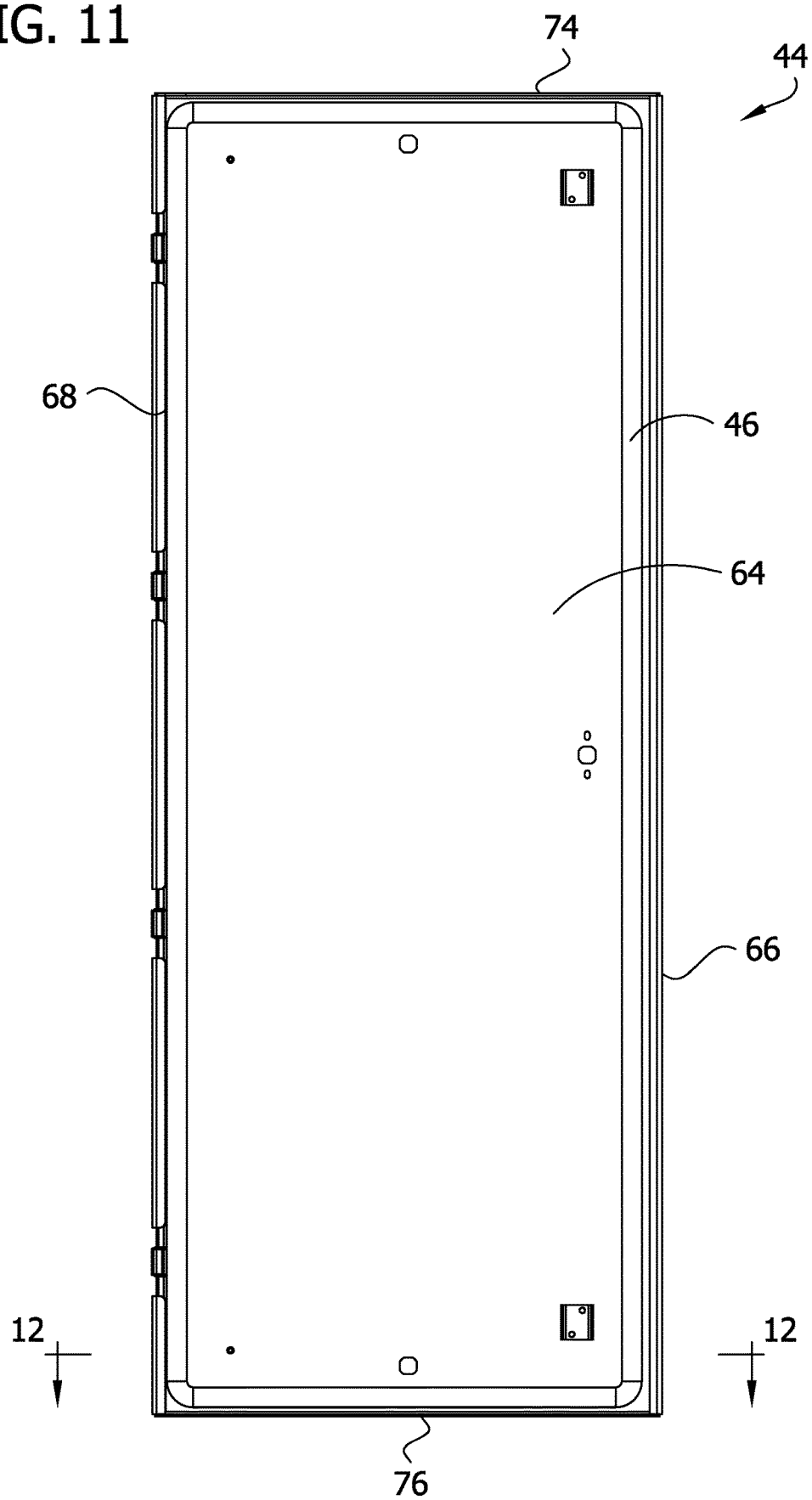
FIG. 11 is a rear elevation of the door panel of FIG. 10, including a door gasket secured to an interior of the door panel.
Figure 12:
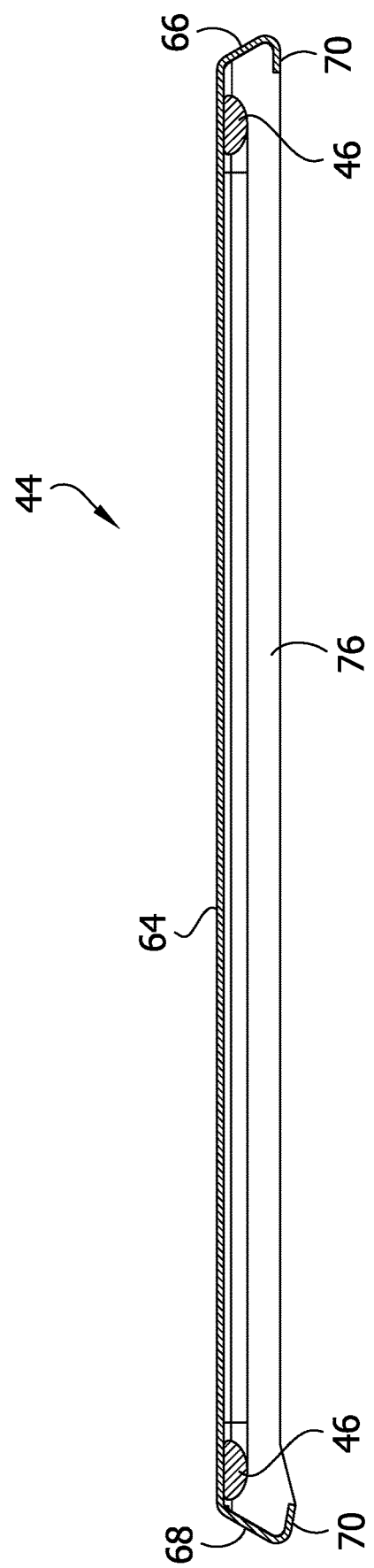
FIG. 12 is a cross section of FIG. 11 taken in the plane defined by the line 11-11.

As can be seen in FIG. 11, each door gasket 46 extends around the interior side of the corresponding door 18, 20 adjacent the periphery thereof. For example, the door gaskets 46 may be secured to the respective doors 18, 20 by adhesive or in other ways. When the left door 18 is closed, the gasket 46 on the left door seats on the left door frame (e.g., the lips 36 and the front flanges 28c) to form a liquid-tight seal therebetween, which extending around an entire perimeter of the left door frame. When the right door 20 is closed, the gasket 46 on the right door seats on the right door frame to form a liquid-tight seal therebetween, which extends around an entire perimeter of the right door frame. In one example, each gasket 46 may comprise one or more compressible strips of material, which may be formed from rubber or other resiliently compressible material. The illustrated door gaskets 46 have a D-shaped cross section, although the gaskets may have other cross-sectional shapes, including but not limited to rectangular, square, oval, circular, ribbed, among others.

Referring to FIGS. 7, 8 and 10-12, each door panel 44 includes a generally planar door panel body 64 having upper, lower, left side and right side edge margins. A left door side flange 66 extends along the left edge margin of the door panel body 64 and projects rearwardly therefrom. A right door side flange 68 extends along the right edge margin of the door panel body 64 and projects rearwardly therefrom. Each of the side door flanges 66, 68, respectively, is angled laterally outward from the associated edge margin, whereby, as shown in FIGS. 7 and 8 for example, each door side flange extends at an angle A1 less than 90 degrees relative to the associated door panel body 64. In one example, the angle A1 may measure from about 100 degrees to about 160 degrees, or from about 110 to about 140 degrees, and in one particularly embodiment, about 120 degrees. In this way, the left and right side door flanges 66, 68 define or form respective beveled left and right sides of the door panel 44. In the illustrated embodiment, a return lip 70 extends from a rear end of each door side flange 66, 68 in a direction generally toward the other return lip. The bend at the return lip 70 provides a smooth edge to inhibit injury that may be caused from a sharper edge. Each return lip 70 may extends at an angle A2 relative to the associated door side flange 66, 68. The angle A2 may measure from about 120 degrees to about 75 degrees, or from about 110 to about 90 degrees, and in one particularly embodiments, about 100 degrees. In one example, each return lip 70 may extends generally parallel to the generally planar door panel body 64. In other embodiments, the return lips 70 may be hemmed. For example, the return lips may be formed as flattened hems 70', as shown in FIG. 5B, or tear drop hems 70", as shown in FIG. 5C, or other types of hems, including but not limited to open hems, and rope hems. In the illustrated embodiment, upper and lower door flanges 74, 76 extend along the respective upper and lower edge margins of each door panel body 64 and project rearwardly therefrom. Each of the upper and lower door flanges 74, 76 may project at an angle A3 relative to the associated door panel body measuring about 90 degrees or other angles. In the illustrated embodiment, the door gasket 46 is disposed inward of and adjacent to each of the door flanges 66, 68, 74, 76.

In the illustrated embodiment, the hinge-side door flanges (e.g., the left door side flange 66 of the left door 18 and the right door side flange 68 of the right door 20) increase the maximum open angle MA to which the respective doors can be opened relative to the front side of the enclosure 10. This increased maximum open angle MA is due to the angled door side flanges 66, 68 defining beveled sides that provide clearance relative to the left and right side walls 24c, 24d as the respective left and/or right doors 18, 20 are open to an angle generally greater than about 135 degrees relative to a front plane defined by the front side of the enclosure 10. In one example, the left and right doors 18, 20 may be openable to a maximum open angle of about 165 degrees. In addition, the angled door side flanges 66, 68 defining the beveled left and right side walls of the doors 18, 20 direct water, such as rain or water from a fire hose, laterally outward away from the seal interface of the left gasket portion and the left portion of the door frame, and laterally outward away from the seal interface the seal interface of the right gasket portion and the right portion of the door frame. Each angled door side flange 66, 68 adjacent the handles (e.g., inner door side flanges) also deflect water away from the seal interfaces, as shown in FIG. 14B, for example.

In the illustrated embodiment, the handle-side door flanges (e.g., the right door side flange 68 of the left door 18 and the left door side flange 66 of the right door 20) generally come together (i.e., are disposed adjacent one another) at the center frame post 30 when the doors are closed. As shown in FIG. 5, when the doors 18, 20 are closed, the handle-side door flanges 66, 68 are received in the channel 80 of the center frame post 30 and generally oppose one another along the height of the enclosure 10. In the illustrated embodiment, the return lips 70 of the handle-side door flanges may be generally parallel to the rear wall 34 of the center frame post 30. As can be seen, the two handle-side flanges 66, 68 define a flange channel 82 extending along the height of the enclosure 10 and having a generally V-shaped cross section with a width W that tapers into the channel 80 of the center frame post 82. Moreover, the angled side door flanges 66, 68 deflects water entering the center frame post 30, thereby reducing the velocity and energy of the water before the water makes contact with the liquid-tight seals. It is believed that the shape of this flange channel 82, as defined by the angled side door flanges, 66, 68, creates a turbulent flow of water when water is directed at the doors 18, 20 in a direction generally perpendicular to the doors. It is further believed that, as compared to laminar flow of water, the turbulent flow of water reduces forces (e.g., liquid pressures) exerted on seal interfaces at the door gasket 46 and the center frame post 30 to inhibit the ingress of water between the seal interfaces and into the interior 14 space of the enclosure 10.

Figure 14A:
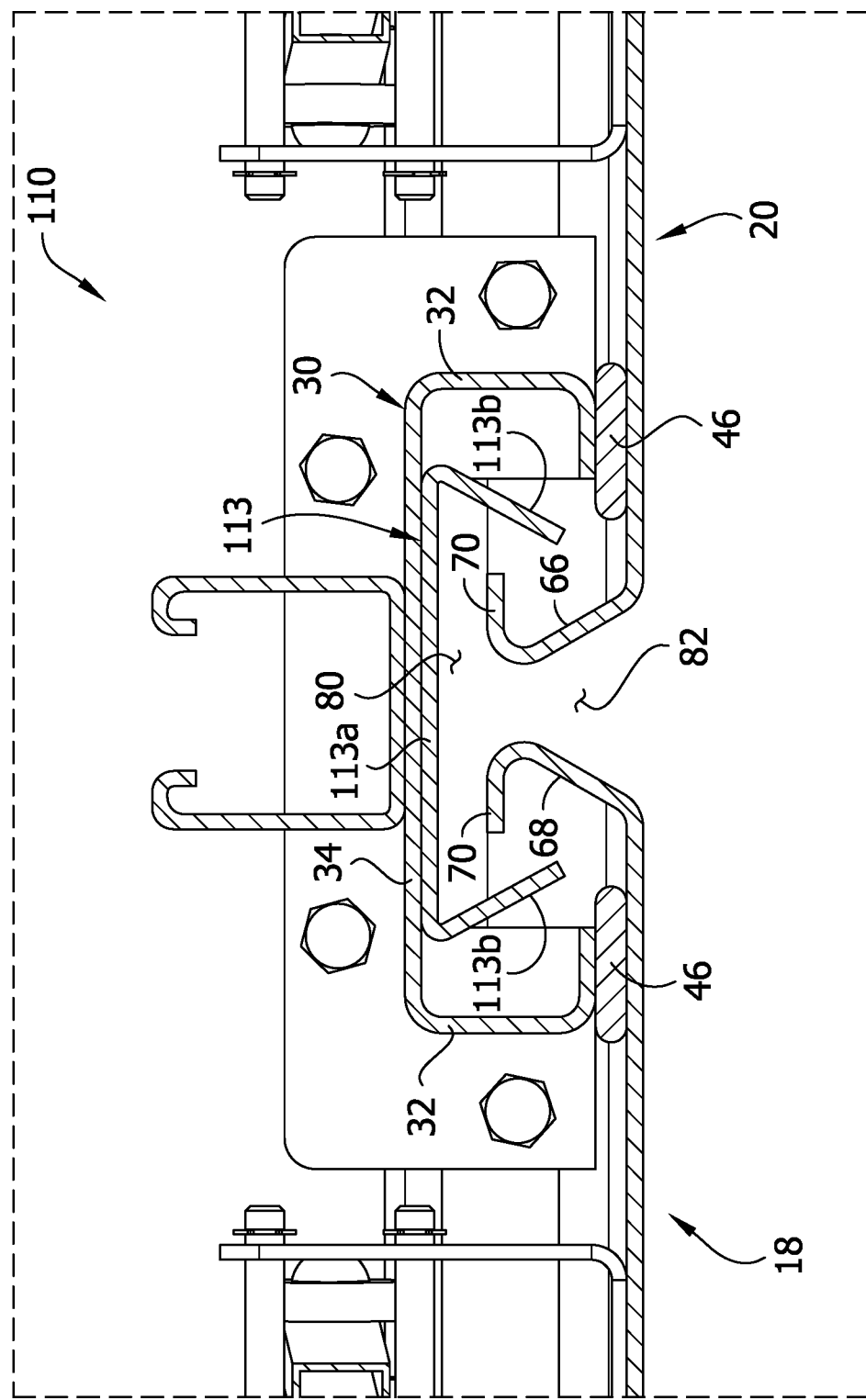
FIG. 14A is cross section of second embodiment of an electrical panel enclosure similar to the first embodiment but including a baffle.

Referring to FIG. 14, another embodiment of an electrical panel enclosure similar to the first electrical panel enclosure 10 is generally indicated at reference numeral 110. Since this enclosure 110 is similar to the first enclosure 10, similar components are indicated by the same reference numerals. Unless otherwise described below herein, the teachings set forth above with respect to the enclosure 10 apply to the present enclosure 110.

Unlike the first enclosure 10, the present enclosure 110 includes a baffle, generally indicated at 113, secured inside the center frame post 30, and in particular, to the front side of the rear wall 34 of the center frame post. The illustrated baffle 113 comprises a channel-shape member (e.g., a strut) extending lengthwise along the center frame post. A rear wall 113a of the baffle 113 is secured (e.g., welded) to the rear wall 34 of the center frame post 30, and opposing side walls 113b extend forward from the rear wall of the baffle. The illustrated side walls 113b extend at acute angles relative to the rear wall 113a, although in other embodiments, the side walls may extend perpendicular to or at obtuse angles with respect to the rear wall 113a. When the left and right doors 18, 20 are closed, the hinge-side flanges 66, 68 extend into the baffle (e.g., the channel 115 defined by the baffle), and the return lips 70 are received in the channel. Thus, the side walls 113b are disposed between (in a liquid flow direction) between the door gaskets 46 and the hinge-side flanges 66, 68. The V-shaped channel 82 is in communication with and leads into the channel 115 of the baffle 113. A clearance gap A (FIG. 14) allows the return lips 70 to move past the side walls 113a, 113b of the baffle 113 to allow opening and closing of the doors 18, 20.

FIG. 14B is a schematic depicting the flow of water from a hose H between the two inner or handle-side side door flanges 66, 68. As can be seen from FIG. 14, the baffle 113 creates a tortuous path for the water as the water flows between the side door flanges 66, 68 and into the channel of the center frame post 30. In effect, the water changes directions as it makes contact with the numerous surfaces of the flanges 66, 68, the return lips 70, the baffle 113, and the center frame post 30. At each instance where the water changes directions, energy and velocity of the water is lost, thereby reducing the energy (e.g., velocity) of the water that contacts the seal interfaces at the gasket 46 and the center frame post 30. In addition, constricted liquid flow paths or channels B1, B2 are defined between the flanges 66, 68 (including the return lips 70) and the baffle 113, and between the door panel bodies 64 and the baffles, respectively. The water then enters an expansion chamber C, which surrounds and is downstream of the seal interface to allow water to flow past the seal interface to an area of less resistance. This further relieves pressure on the seal interface. The baffle 113 may also create and/or further facilitate a turbulent flow of water and/or inhibits water flow toward the door gaskets 46 when water is directed at the doors 18, 20 in a direction generally perpendicular to the doors. It is further believed that, as compared to laminar flow of water, the turbulent flow of water reduces forces (e.g., liquid pressures) exerted on seal interfaces at the door gasket 46 and the center frame post 30 to inhibit the ingress of water between the seal interfaces and into the interior 14 space of the enclosure 10. It is understood that in other embodiments the doors 18, 20 may have conventional side flanges. That is the side flanges may not define the beveled side walls 66, 68, as described herein. For example, the side flanges may extend generally perpendicular to the respective door panel bodies.

Figure 15:
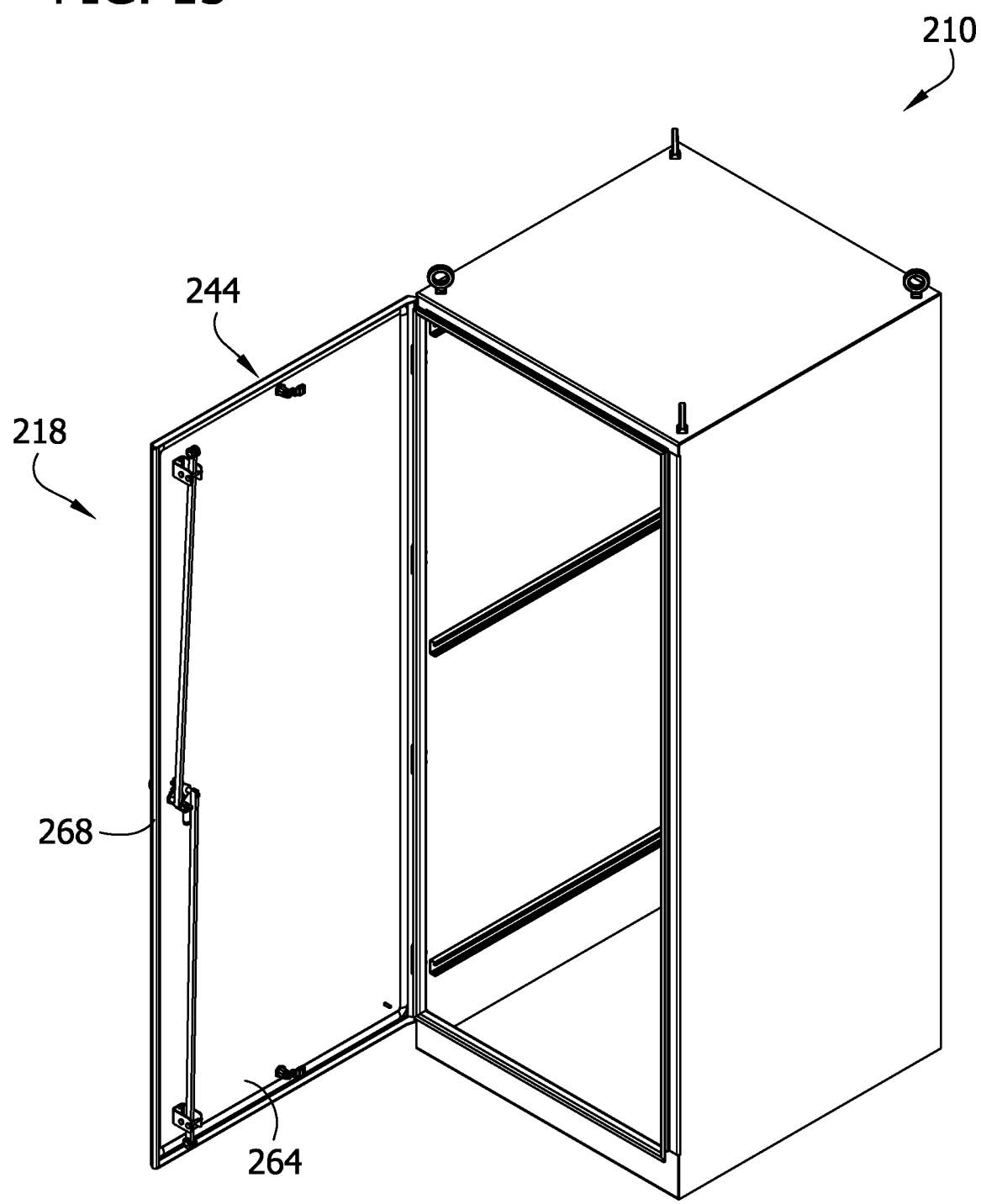
FIG. 15 is a perspective of a third embodiment of an electrical panel enclosure, a door of the enclosure being in an open position.
Figure 16:
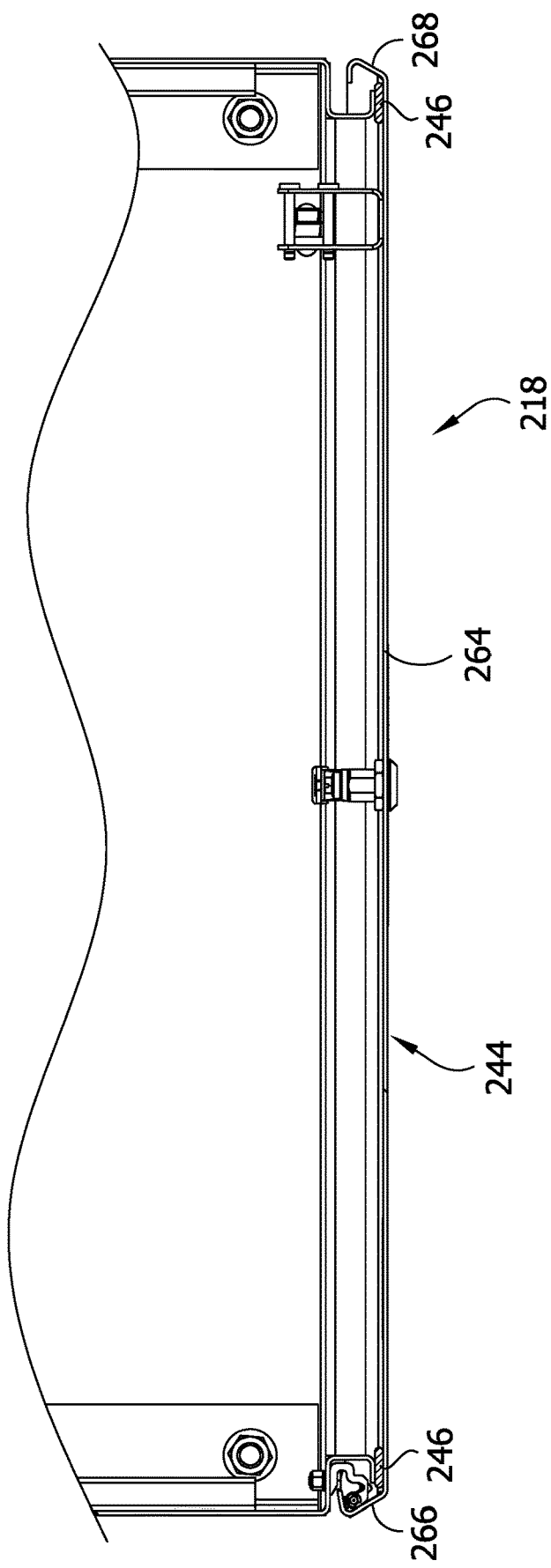
FIG. 16 is a cross section of the third embodiment of the electrical panel enclosure, the door of the enclosure being in a closed position.

Referring to FIGS. 15 and 16, another embodiment of an electrical panel enclosure similar to the first electrical panel enclosure 10 is generally indicated at reference numeral 210. Since this enclosure 210 is similar to the first enclosure 10, similar components are indicated by like reference numerals plus 200. Unless otherwise described below herein, the teachings set forth above with respect to the enclosure 10 apply to the present enclosure 210.

Unlike the first enclosure 10, the third enclosure 210 includes a single door 218 hingedly secured to the enclosure body 212 via one or more hinges 240. The teachings set forth above with respect to the door 18 apply equally to the present door 118. That is, the present door 218 includes a door panel (e.g., sheet metal panel), generally indicated at 244; a door gasket 246 secured to an interior side of the door panel; and a door handle assembly, generally indicated at 248, secured to the door panel. Moreover, a left door side flange 266 extends along the left edge margin of the door panel body 264 and projects rearwardly therefrom, and a right door side flange 268 extends along the right edge margin of the door panel body 264 and projects rearwardly therefrom. Each of the side door flanges 266, 268, respectively, is angled laterally outward from the associated edge margin, as taught above with respect to the door 18. Because the second enclosure 210 includes only the single door 218, the enclosure does not include the center post frame of the first enclosure 10. Instead, the handle-side door flange (e.g., the right side door flange 268) directs direct water, such as rain or water from a fire hose, laterally outward away from the seal interface the seal interface of the right gasket portion and the right portion of the door frame, rather than into a channel of a center frame post. The hinge-side door flange (e.g., the left side door flange 266) performs the same function.

Figure 17:
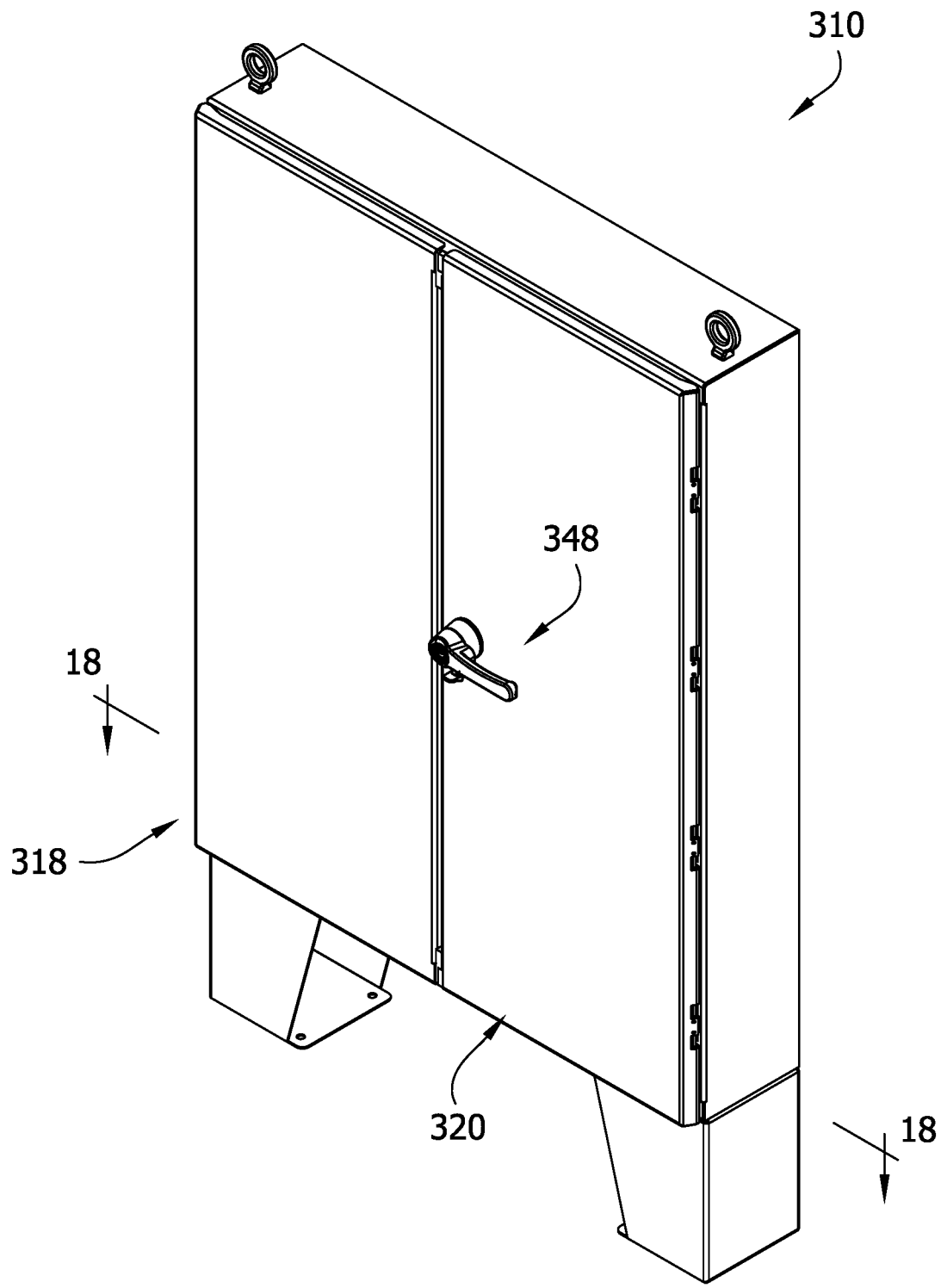
FIG. 17 is a perspective of a fourth embodiment of an electrical panel enclosure.
Figure 18:
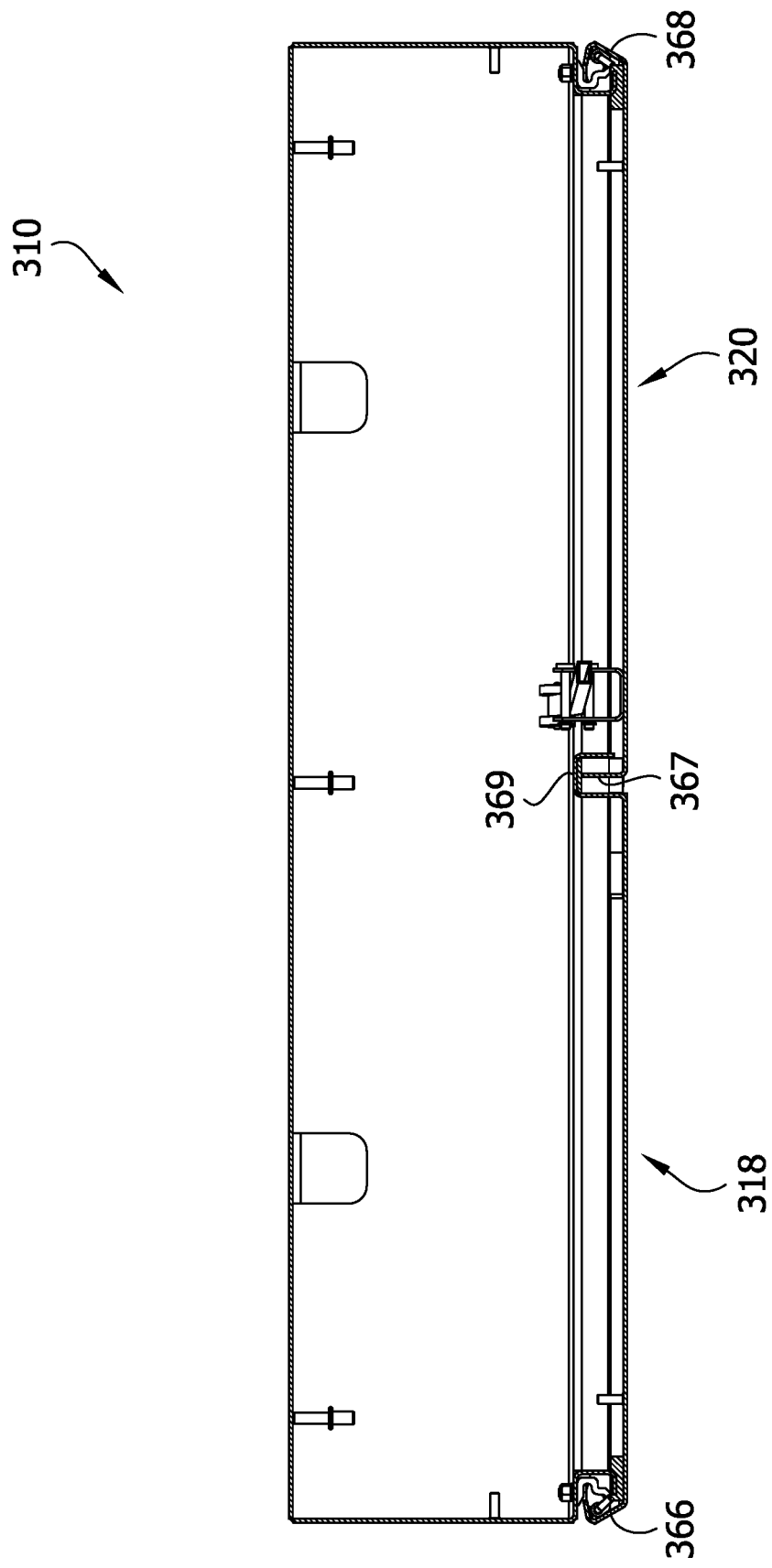
FIG. 18 is a cross section of the fourth embodiment of the electrical panel enclosure taken in the plane defined by the line 18-18 in FIG. 17.

Referring to FIGS. 17 and 18, another embodiment of an electrical panel enclosure similar to the first electrical panel enclosure 10 is generally indicated at reference numeral 310. Since this enclosure 310 is similar to the first enclosure 10, similar components are indicated by like reference numerals plus 200. Unless otherwise described below herein, the teachings set forth above with respect to the enclosure 10 apply to the present enclosure 310.

The present enclosure 310 includes two doors 218, 220, but unlike the first embodiment 10, the present enclosure 310 does not include a center frame post and only the right door includes a door handle assembly 348. Instead, the right door 320 includes an inner or door-handle side flange 367 that nests within a channel defined by an inner or door-handle side flange 369 of the left door 318. Accordingly, the inner or door-handle side flanges 367, 369 are not of the same type as the corresponding flanges of the first embodiment. However, the hinge-side door flanges (e.g., the left-side door flange 366 of the left door 318 and the right-side door flange 368 of the right door) are the same as the first embodiment 10. Therefore, the two doors 318, 320 have increased maximum open angles, as described above.

Figure 19:
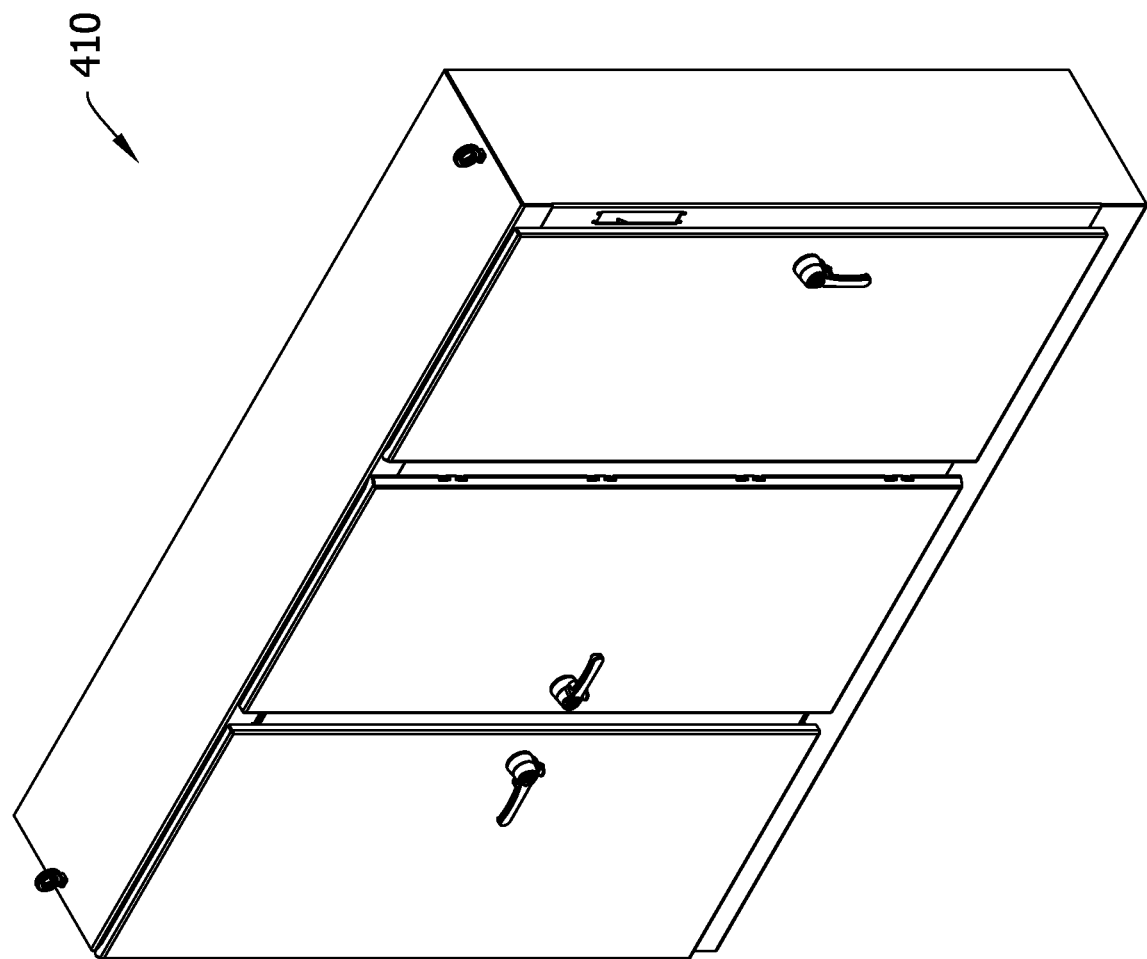
FIG. 19 is a perspective of a fifth embodiment of an electrical panel enclosure.

Referring to FIG. 19, another embodiment of an electrical panel enclosure is generally indicated at reference numeral 410. This enclosure 410 is essentially a combination of enclosures 10 and 210 into a single enclosure. That is this enclosure includes the doors 18, 20, 210 of the enclosures 10 and 210 to form a large enclosure with three different accesses to the interior of the enclosure. The teachings set forth above with respect to doors 18, 20, and 210 apply equally to this enclosure 410.

Modifications and variations of the disclosed embodiments are possible without departing from the scope of the invention defined in the appended claims.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions, products, and methods without departing from the scope of the invention, it is intended that all matter contained in the above description and shown in the accompanying drawings shall be interpreted as illustrative and not in a limiting sense.

What is claimed is:

1. An electrical panel enclosure configured to house electrical components, the electrical panel enclosure comprising:
    an enclosure body including walls secured to one another and defining an interior space in which the electrical components are housed, the enclosure body defining an open front side leading to the interior space;
    a door hingedly secured to the enclosure body at the front side of the enclosure body, the door including a door panel having a planar door panel body with opposite first and second side edge margins, and a first side door flange extending rearwardly from the first side edge margin of the door panel body and defining a first exterior side of the door, wherein the first side door flange extends at an angle greater than 90 degrees relative to the planar door panel body,
    wherein the door further includes a second side door flange extending rearwardly from the second side edge margin of the door panel body and defining a second exterior side of the door, wherein the second side door flange extends at an angle greater than 90 degrees relative to the planar door panel body.

2. The electrical panel enclosure set forth in claim 1, wherein the first side edge margin of the door panel body is hingedly secured to the enclosure body.

3. The electrical panel enclosure set forth in claim 1, wherein the second side edge margin of the door panel body is hingedly secured to the enclosure body.

4. The electrical panel enclosure set forth in claim 1, wherein the door further includes a door gasket secured to an interior perimeter of the door panel body, wherein the door gasket is configured to seal with the enclosure body at the front side of the enclosure body when the door is in a closed position.

5. The electrical panel enclosure set forth in claim 4, wherein the enclosure body defines a door frame at the front side of the enclosure body, the gasket configured to seal with the door frame when the door is in the closed position.

6. The electrical panel enclosure set forth in claim 1, wherein the door constitutes a first door, the electrical panel enclosure further comprising a second door hingedly secured to the enclosure body at the front side of the enclosure body, the second door including a second door panel having a planar second door panel body with opposite first and second side edge margins, and a first side door flange of the second door extending rearwardly from the first side edge margin of the second door panel body, wherein the second side door flange of the second door panel extends at an angle greater than 90 degrees relative to the second planar door panel body.

7. The electrical panel enclosure set forth in claim 6, wherein the first side door flanges of the first and second doors generally oppose one another when the first and second doors are in a closed position.

8. The electrical panel enclosure set forth in claim 7, wherein the first side door flanges of the first and second doors define a generally V-shaped channel when the first and second doors are in the closed position.

9. The electrical panel enclosure set forth in claim 8, wherein the second door includes a second side door flange extending rearwardly from the second side edge margin of the second door panel body, wherein the second side door flange of the second door extends at an angle greater than 90 degrees relative to the second door panel body.

10. The electrical panel enclosure set forth in claim 9, wherein the second side edge margin of each of the first and second door panel bodies is hingedly secured to the enclosure body.

11. The electrical panel enclosure set forth in claim 9, wherein the first door further includes a first door gasket secured to an interior perimeter of the first door panel body, wherein the first door gasket is configured to seal with the enclosure body at the front side of the enclosure body when the first door is in a closed position, wherein the second door further includes a second door gasket secured to an interior perimeter of the second door panel body, wherein the second door gasket is configured to seal with the enclosure body at the front side of the enclosure body when the second door is in a closed position.

12. The electrical panel enclosure set forth in claim 11, wherein the enclosure body defines a first door frame at the front side of the enclosure body, the first door gasket configured to seal with the first door frame when the first door is in the closed position, wherein the enclosure body defines a second door frame at the front side of the enclosure body, the second door gasket configured to seal with the second door frame when the second door is in the closed position.

13. The electrical panel enclosure set forth in claim 12, wherein the first and second door frames are partially defined by a center frame post.

14. The electrical panel enclosure set forth in claim 13, wherein the center frame post includes a rear wall and opposite first and second side walls extending forward from the rear wall of the center frame post defining a heightwise channel, wherein the first side door flange of the first door is received in the heightwise channel when the first door is in a closed position, wherein the first side door flange of the second door is received in the heightwise channel when the second door is in a closed position.

15. The electrical panel enclosure set forth in claim 14, wherein the center frame post further includes first and second return flanges extending toward one another from front ends of the respective opposite first and second side walls of the center frame post.

16. The electrical panel enclosure set forth in claim 11, further comprising a baffle secured to the enclosure body, wherein the baffle is disposed between the first door gasket and the first side door flange of the first door to impede liquid flow toward the first door gasket when the first door is in the closed position, wherein the baffle is disposed between the second door gasket and the second side door flange of the second door to impede liquid flow toward the second door gasket when the second door is in the closed position.

17. The electrical panel enclosure set forth in claim 16, wherein the baffle defines a channel extending heightwise, wherein the first side door flanges are received in the channel of the baffle when the first and second door are in the closed positions.

18. The electrical panel enclosure set forth in claim 1, wherein the first side door flange is disposed outside the interior space of the enclosure body when the door is closed.

* * * * *